(12) United States Patent
Hu et al.

(10) Patent No.: US 10,480,126 B2
(45) Date of Patent: Nov. 19, 2019

(54) SUPER CLEAR CELLULOSE PAPER

(71) Applicant: UNIVERSITY OF MARYLAND AT COLLEGE PARK, College Park, MD (US)

(72) Inventors: Liangbing Hu, Hyattsville, MD (US); Zhiqiang Fang, Hyattsville, MD (US); Hongli Zhu, College Park, MD (US)

(73) Assignee: UNIVERSITY OF MARYLAND AT COLLEGE PARK, College Park, MD (US)

( * ) Notice: Subject to any disclaimer, the term of this patent is extended or adjusted under 35 U.S.C. 154(b) by 43 days.

(21) Appl. No.: 15/225,178

(22) Filed: Aug. 1, 2016

(65) Prior Publication Data

US 2018/0010299 A1 Jan. 11, 2018

Related U.S. Application Data

(63) Continuation-in-part of application No. 14/563,387, filed on Dec. 8, 2014.
(Continued)

(51) Int. Cl.
*D21H 11/02* (2006.01)
*C01B 32/182* (2017.01)
(Continued)

(52) U.S. Cl.
CPC ........... *D21H 11/02* (2013.01); *C01B 32/182* (2017.08); *D21H 11/20* (2013.01); *D21H 17/07* (2013.01);
(Continued)

(58) Field of Classification Search
None
See application file for complete search history.

(56) References Cited

U.S. PATENT DOCUMENTS

| | | | | |
|---|---|---|---|---|
| 2,108,808 A | * | 2/1938 | Finzel et al. | D21H 17/28 101/473 |
| 2,635,970 A | * | 4/1953 | Salo et al. | D21H 17/11 427/415 |
| 2012/0299638 A1 | * | 11/2012 | Han | G06F 3/044 327/517 |

FOREIGN PATENT DOCUMENTS

EP  2402504 A1 * 1/2012 ............. D21H 21/26
JP  2012177771 A * 9/2012

OTHER PUBLICATIONS

Kawamukai et al., Optical Film, Sep. 13, 2012, machine translation of JP2012-177771 (Year: 2012).*
(Continued)

*Primary Examiner* — Chinessa T. Golden
(74) *Attorney, Agent, or Firm* — Sughrue Mion, PLLC

(57) ABSTRACT

Wood fibers possess natural unique hierarchical and mesoporous structures that enable a variety of new applications beyond their traditional use. For the first time we dramatically modulate the propagation of light through random network of wood fibers. A highly transparent and clear paper with transmittance >90% and haze <1.0% applicable for high-definition displays is achieved. By altering the morphology of the same wood fibers that form the paper, highly transparent and hazy paper targeted for other applications such as solar cell and anti-glare coating with transmittance >90% and haze >90% is also achieved. A thorough investigation of the relation between the mesoporous structure and the optical properties in transparent paper was conducted, including full-spectrum optical simulations. We demonstrate commercially competitive multi-touch touch-screen with clear paper as a replacement for plastic substrates, which shows excellent process compatibility and comparable device performance for commercial applications. Transparent cellulose paper with tunable optical prop-
(Continued)

erties is an emerging photonic material that will realize a range of much improved flexible electronics, photonics and optoelectronics.

5 Claims, 49 Drawing Sheets

Related U.S. Application Data

(60) Provisional application No. 61/912,923, filed on Dec. 6, 2013, provisional application No. 62/199,372, filed on Jul. 31, 2015.

(51) Int. Cl.
*D21H 11/20* (2006.01)
*D21H 17/07* (2006.01)
*D21H 17/66* (2006.01)
*H01L 31/0392* (2006.01)
*H02S 40/44* (2014.01)
*H01L 51/00* (2006.01)
*H01L 51/42* (2006.01)

(52) U.S. Cl.
CPC ....... *D21H 17/66* (2013.01); *H01L 31/03926* (2013.01); *H01L 51/0093* (2013.01); *H01L 51/0097* (2013.01); *H02S 40/44* (2014.12); *C01B 2204/22* (2013.01); *C01P 2006/60* (2013.01); *H01L 51/42* (2013.01); *Y02E 10/549* (2013.01)

(56) References Cited

OTHER PUBLICATIONS

Boensch et al., Transparent Paper Containing Fibrous Materials, Jan. 4, 2012, machine translation of EP 2402504 (Year: 2012).*

* cited by examiner

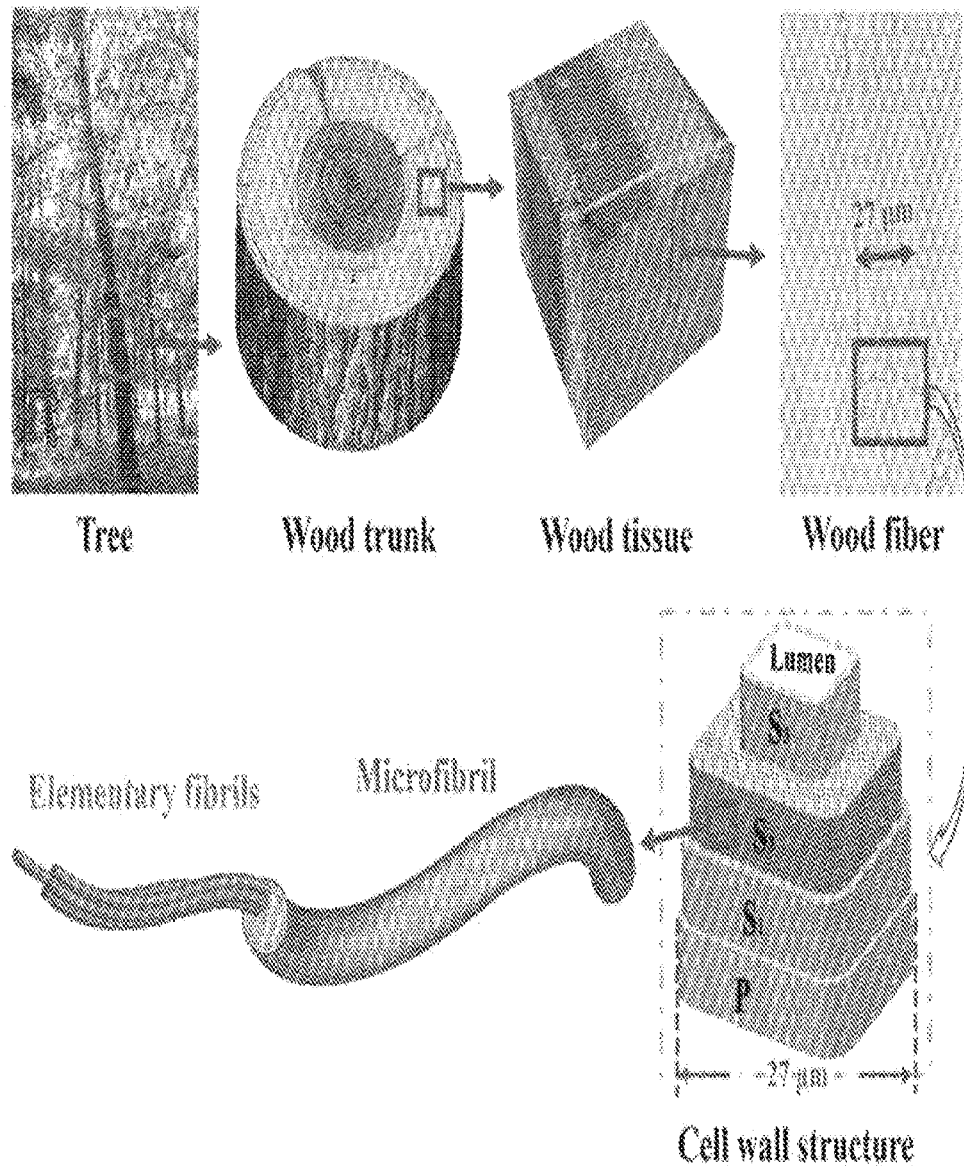

Regular paper

Our transparent paper

Cellulose

TEMPO-oxidized Cellulose

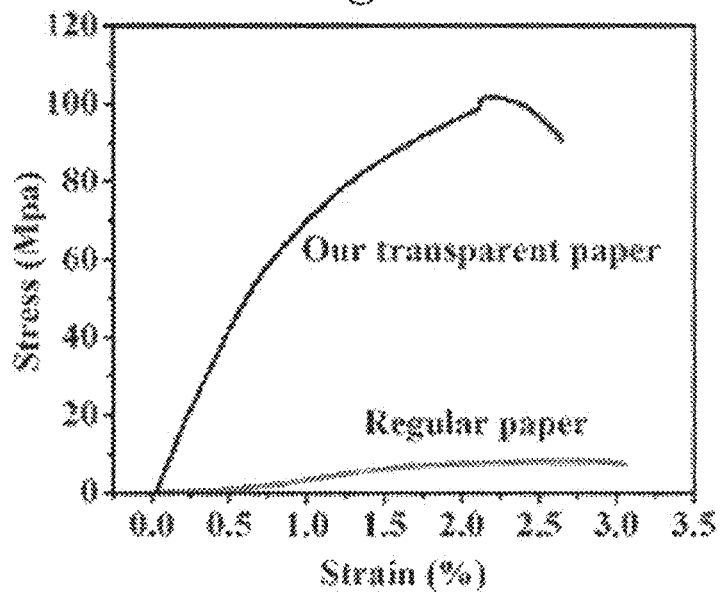
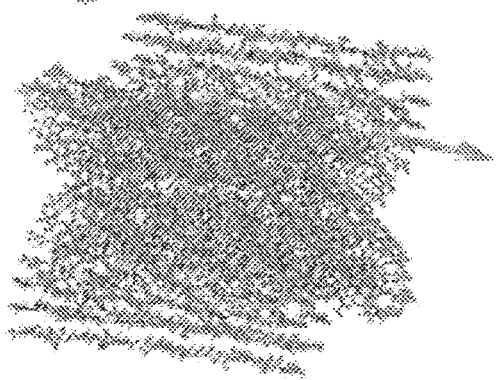
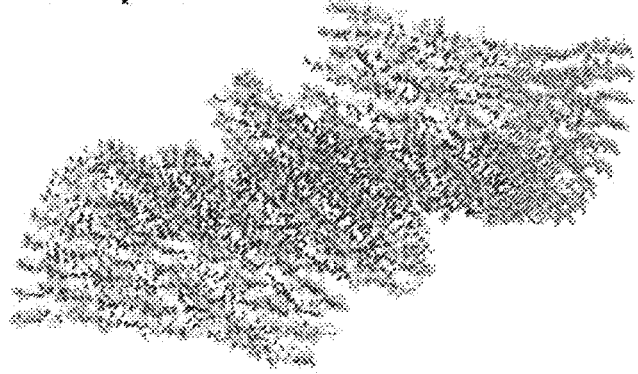

TEMPO-oxidized fiber 1    Snapshot 2

TEMPO-oxidized fiber 2

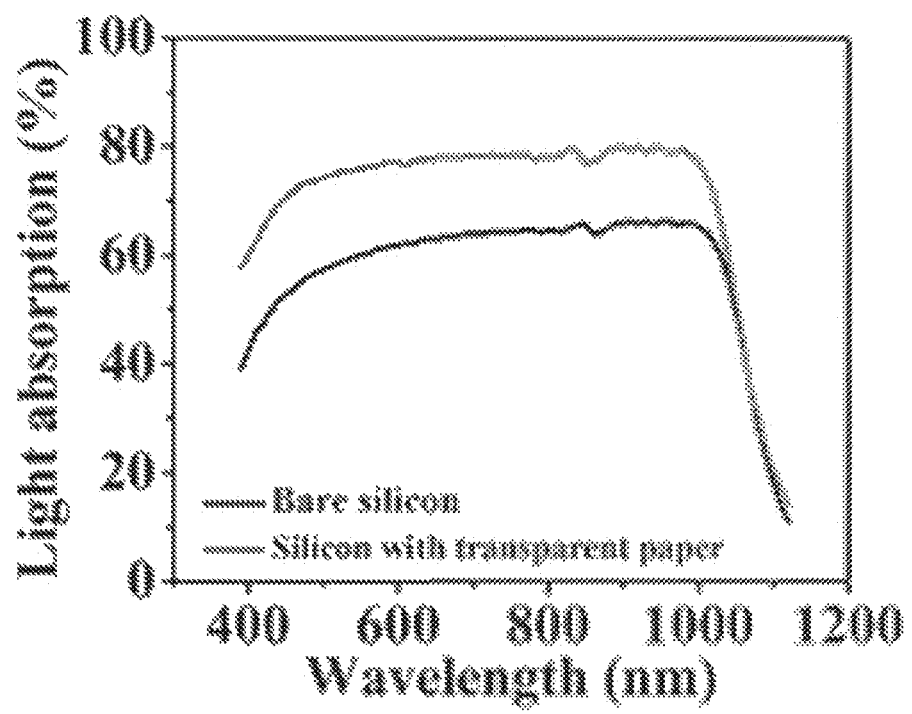

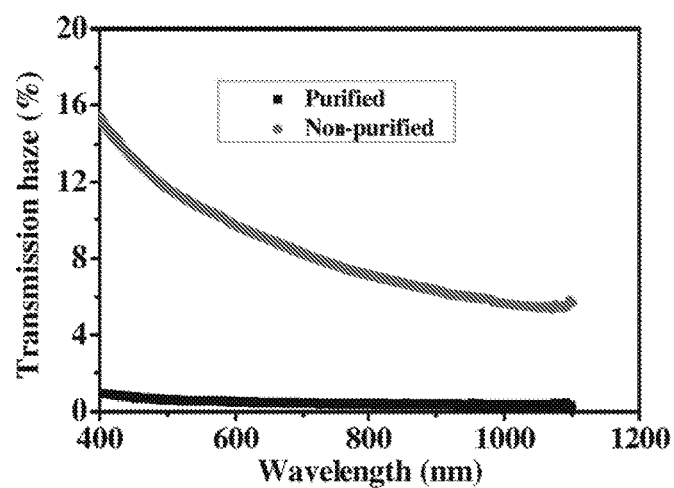
Fig. 9 Transmission haze of transparent paper made of non-purified CNF and purified CNF (paper thickness is ~40-50 µm)

Original cellulose fiber 1

Original cellulose fiber 2

TEMPO-oxidized cellulose flake 1

TEMPO-oxidized cellulose flake 2

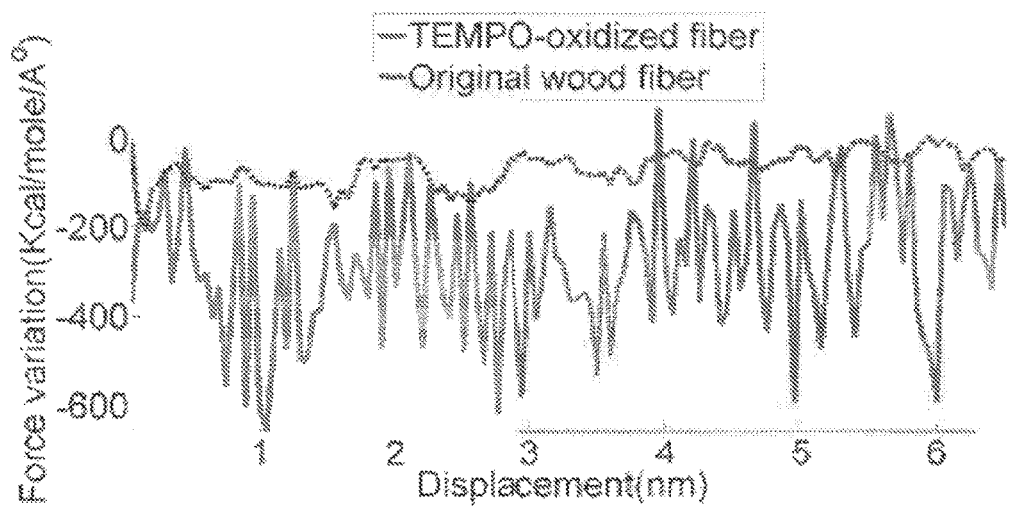

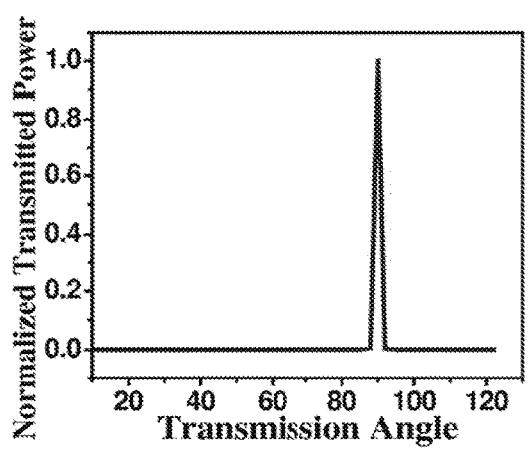
Fig. 11 Angular distribution of forwarded light scattering of transparent and super clear paper.

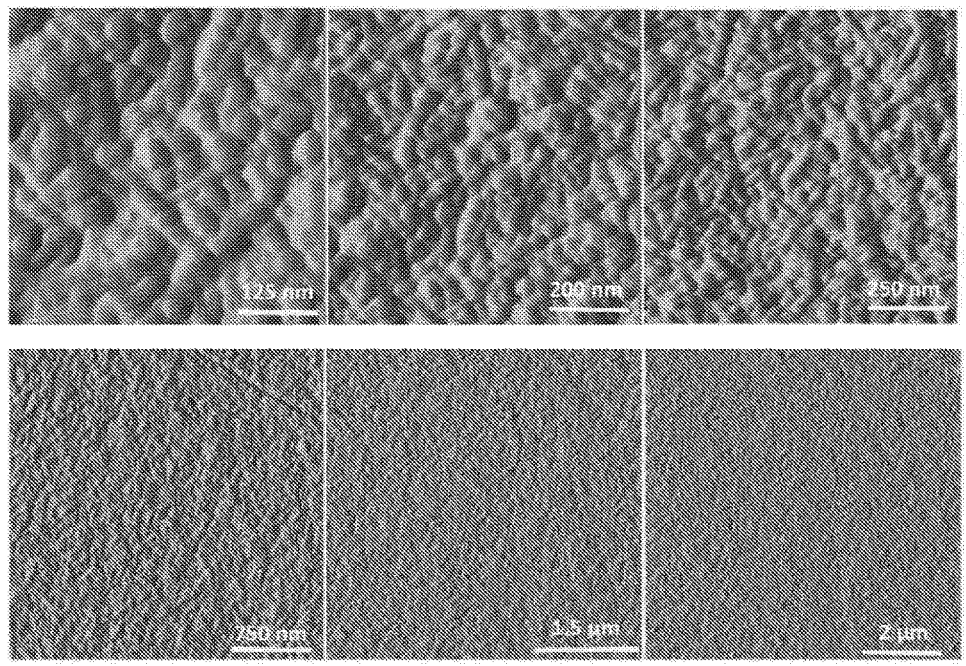
Fig. 13 AFM phase image of super clear paper with scan area from 500 nm*500 nm to 8 μm*8 μm. Nanofiber morphology is clearly presented. The uniform paper surface is well defined.

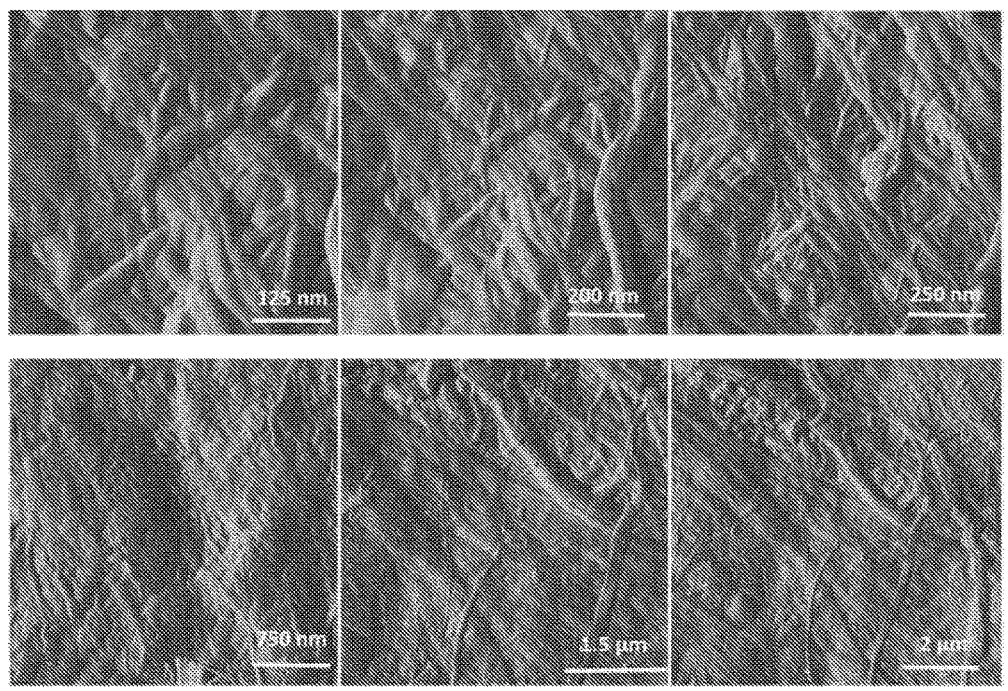
Fig. 14 AFM phase image of super hazy paper with a scan area from 500 nm *500 nm to 8 μm*8 μm. Both remained microfiber backbone and dissolved nanofiber are clearly observed.

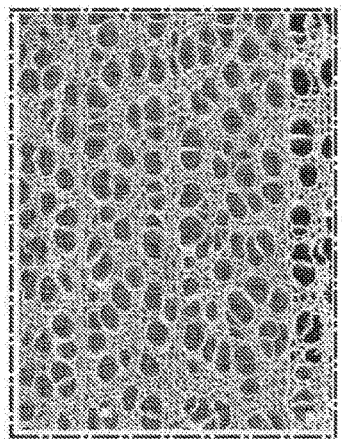
FIG. 15c
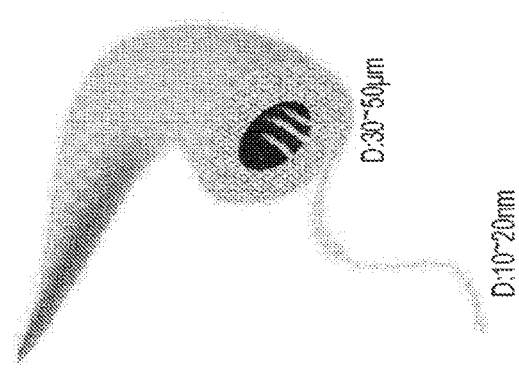
FIG. 15d
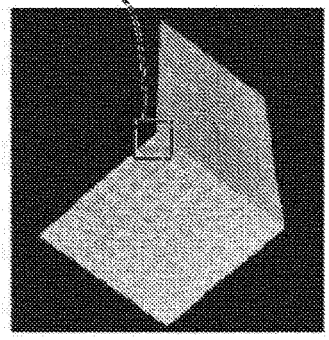
FIG. 15b
FIG. 15e
FIG. 15g
FIG. 15a
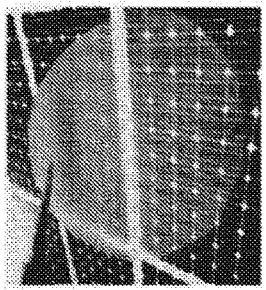
FIG. 15f
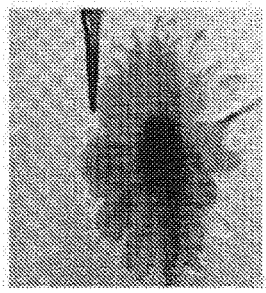
FIG. 15h

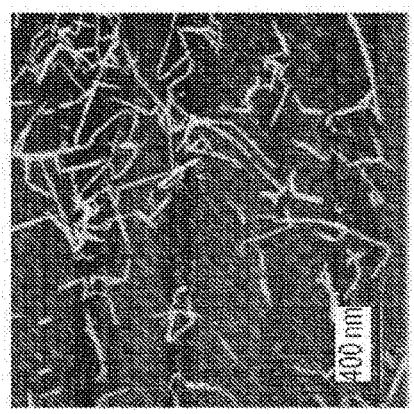
FIG. 16a
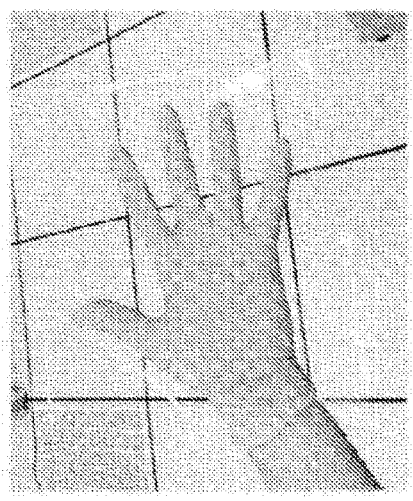
FIG. 16b
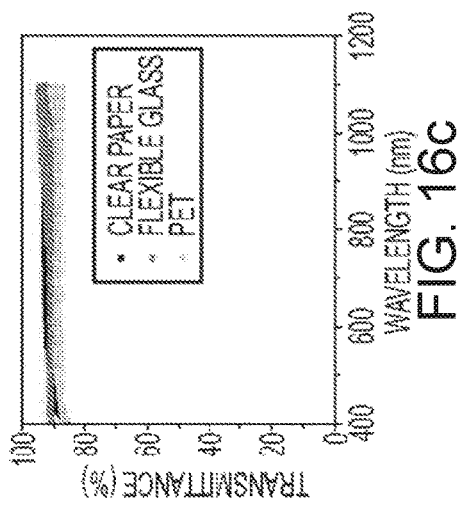
FIG. 16c
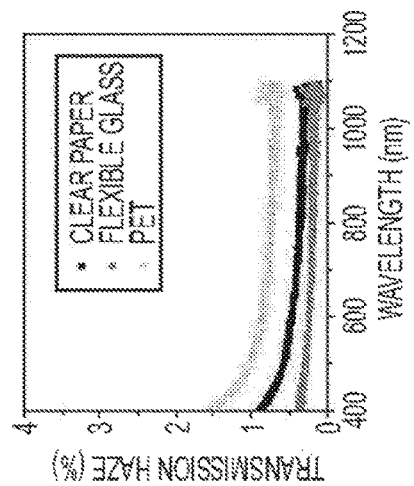
FIG. 16d
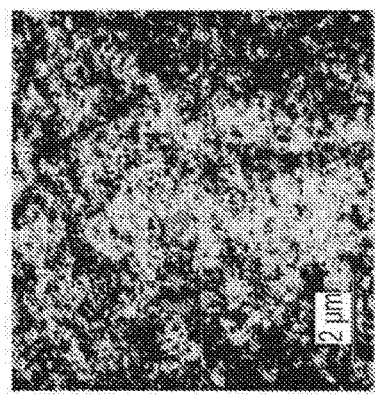
FIG. 16e
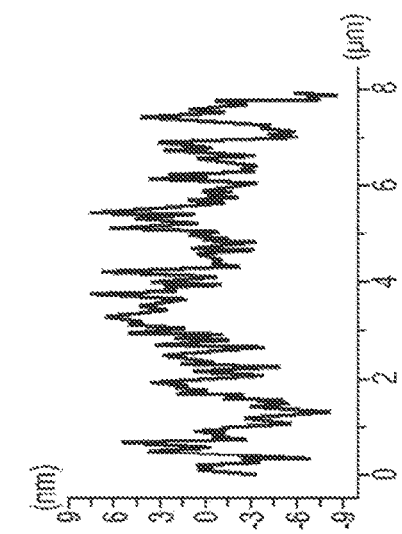

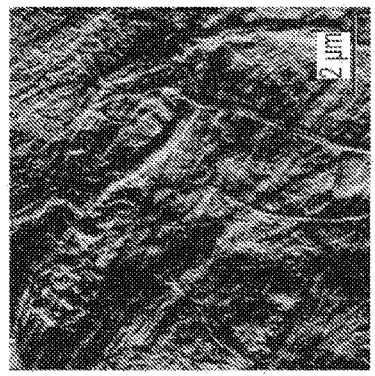
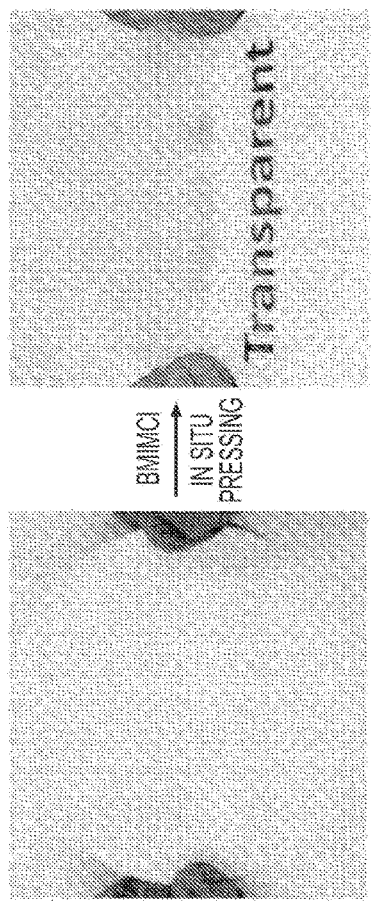
FIG. 17a
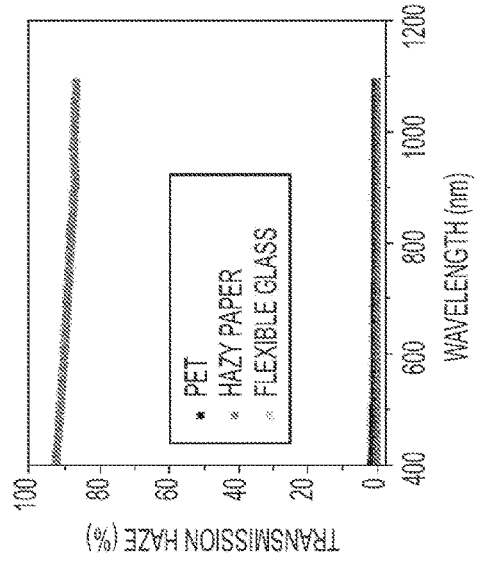
FIG. 17b
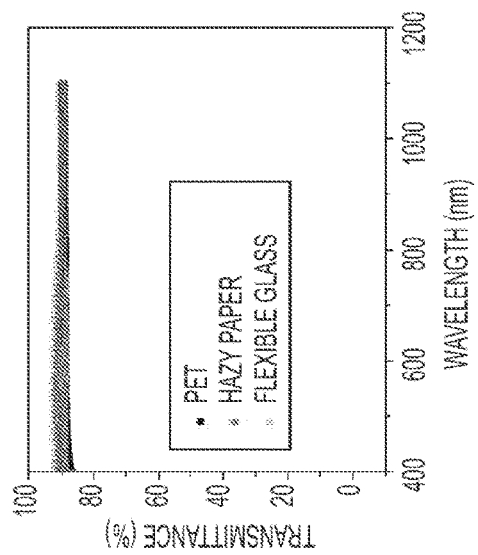
FIG. 17c
FIG. 17d

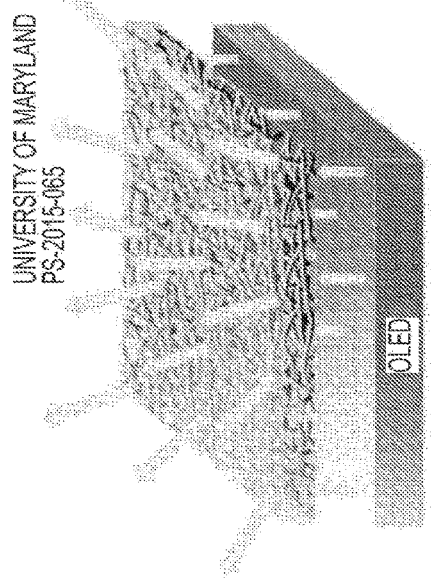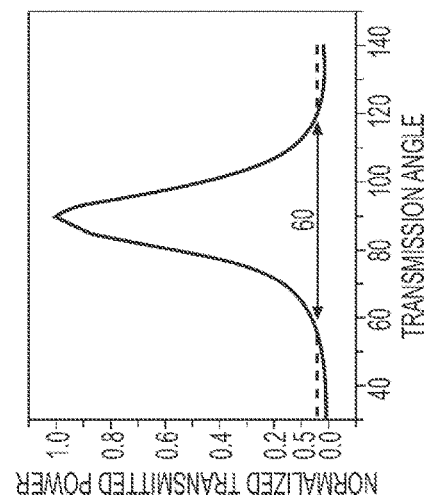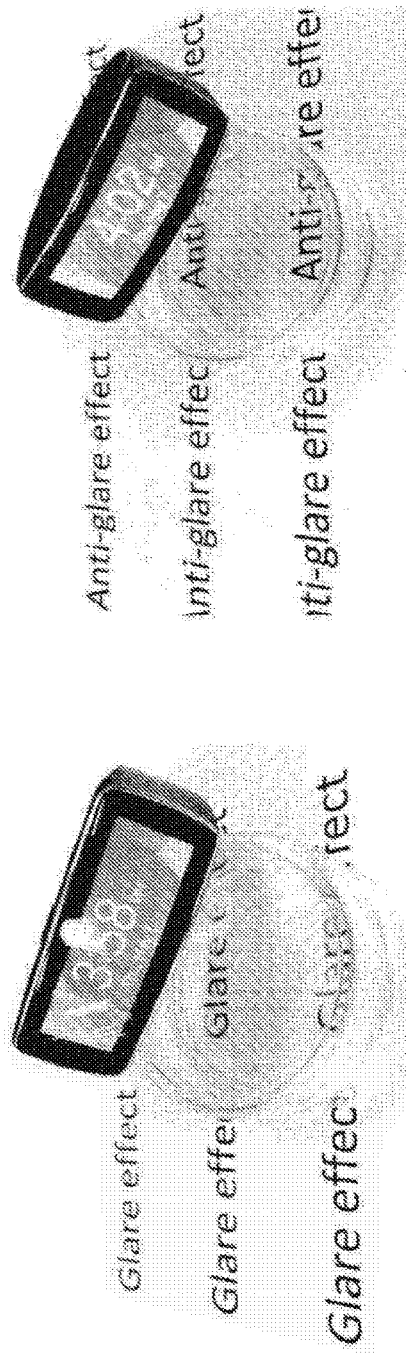
FIG. 21a  FIG. 21b  FIG. 21c  FIG. 21d

Measurement setup for angular dependent transmittance.
The angular distribution of transmitted light was measured with a rotating light detector. The light incident direction is set as 90°.
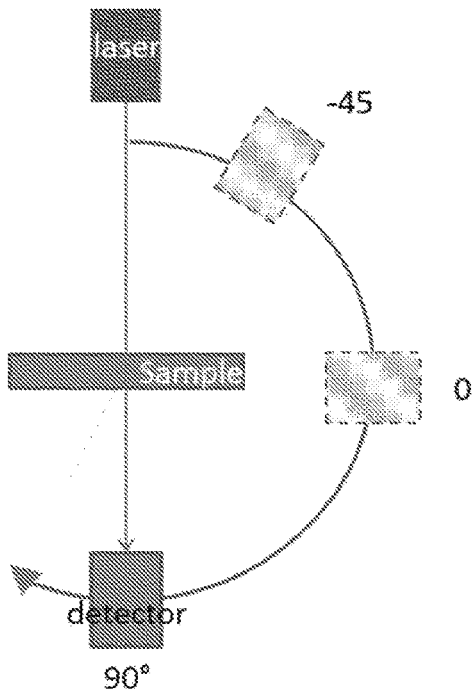
Fig. 25. Experiment diagram of diffusion scattering angular test.

Angular dependence of transmittance in super clear paper
The light propagate with small forward scattering in super clear paper.
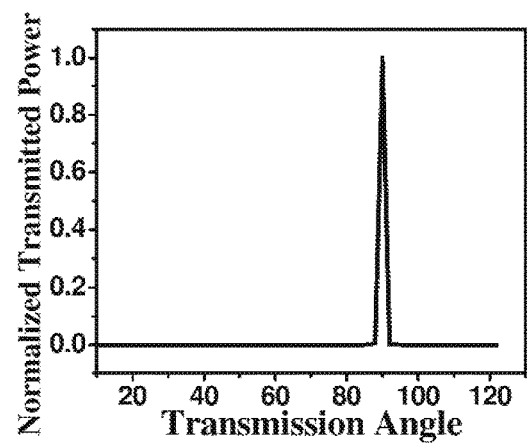
Fig. 26. Angular distribution of forwarded light scattering of transparent and super clear paper.

AFM phase image of the super clear paper.
The nanofiber is well defined in the AFM image and a smooth surface is observable.
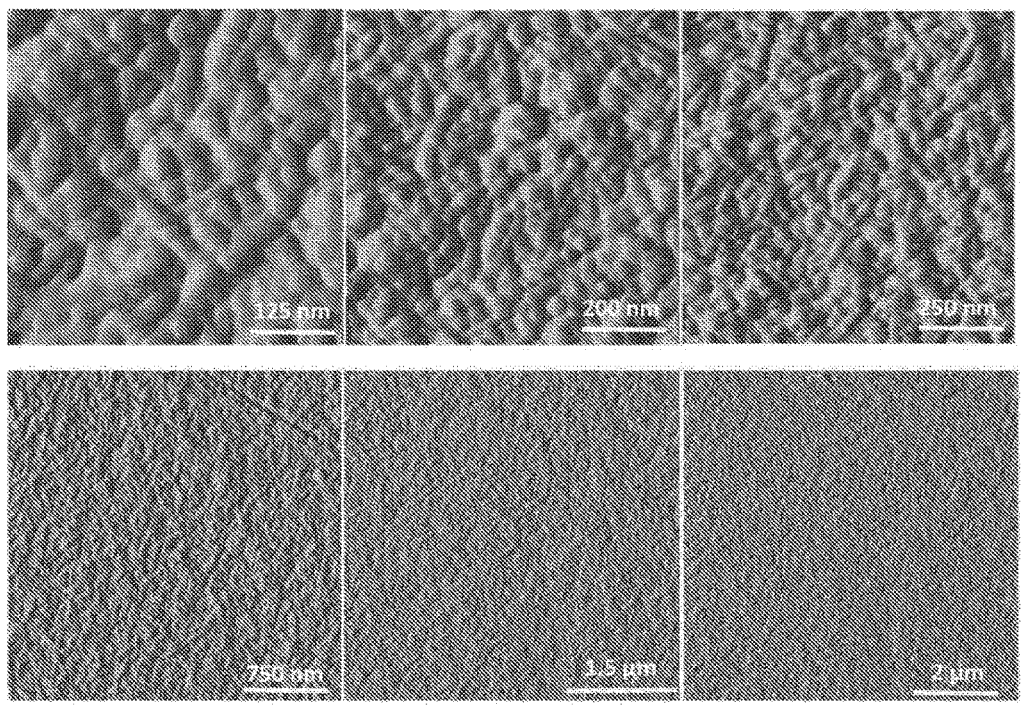
Fig. 28 AFM phase image of super clear paper with scan area from 500 nm*500 nm to 8 μm*8 μm. Nanofiber morphology is clearly presented. The uniform paper surface is well defined.

AFM phase image of the super hazy paper.
Partially dissolved nanofiber is well defined. Meanwhile, the large fiber backbone is maintained in the hazy paper.
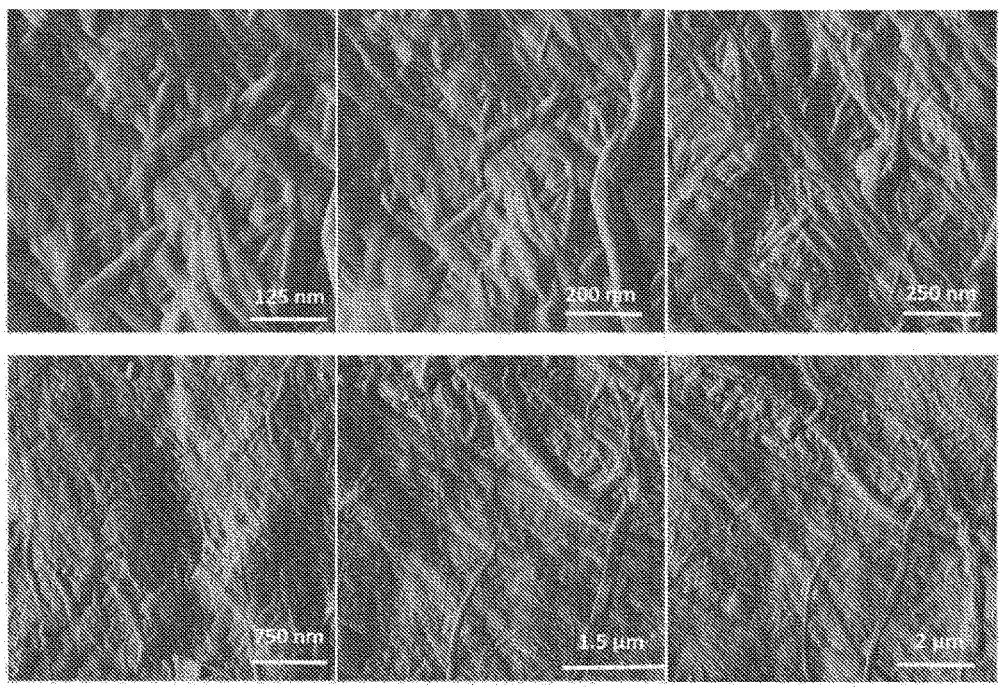
Fig. 29 AFM phase image of super hazy paper with a scan area from 500 nm *500 nm to 8 μm*8 μm. Both remained microfiber backbone and dissolved nanofiber are clearly observed.

X-ray topography of the super hazy paper.
X-ray topography shows the maintained large fiber morphology.
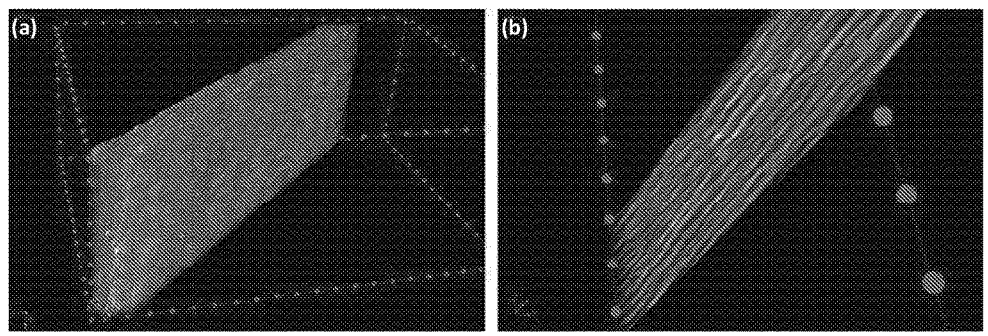
Fig. 30 (a) The layer-by-layer structure is clearly seen in the zoom in image. (b) The large fiber backbone is remained in the super hazy paper.

Characterization of regular paper (BET pore distribution and morphology)

Regular paper has the similar mesopore distribution with a pore width smaller than 10 nm. Meanwhile, there are obvious large pores with a diameter around 50 μm in regular paper, which is dramatically different with super hazy paper.

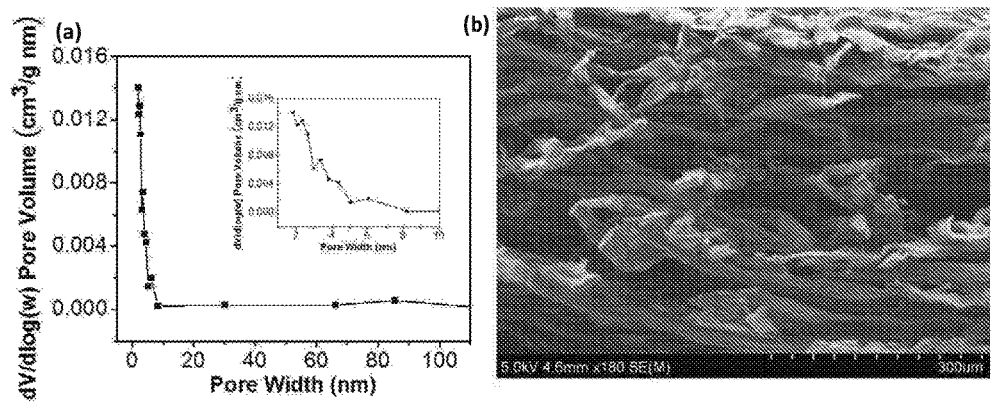

Fig. 31 (a) BET-BJH pore distribution of regular paper. Inset shows the pore distribution at 2-10 nm; (b) Cross section SEM image of regular paper shows large pores.

Laser patterning of graphene-on-paper
The laser accurately patterns single layer graphene without any damage to super clear paper.
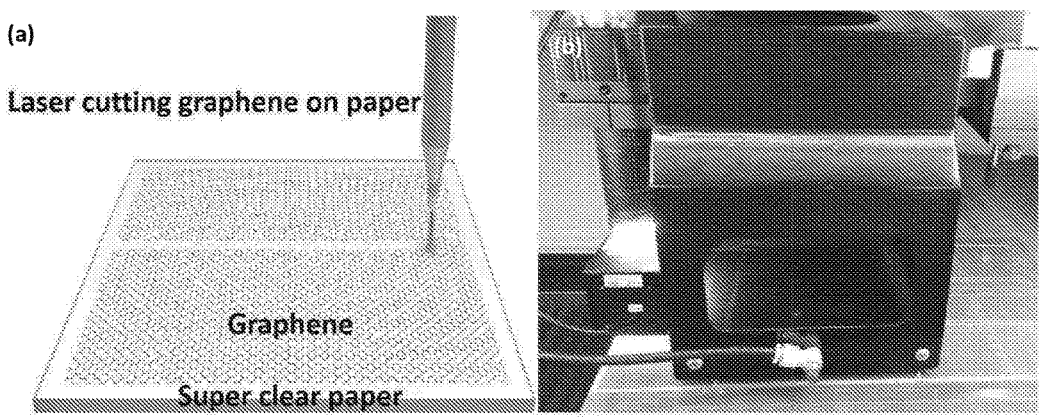
Fig. 32 (a) Schematic to show the laser cutting graphene on the super clear paper. (b) A picture of the laser cutting device. The red dot in the picture shows the position of infrared laser.

Touch screen durability test.
Bending tests with a radius of 3 mm displays excellent durability, which is due to the good adhesion between graphene and super clear paper, and excellent durability of clear paper.
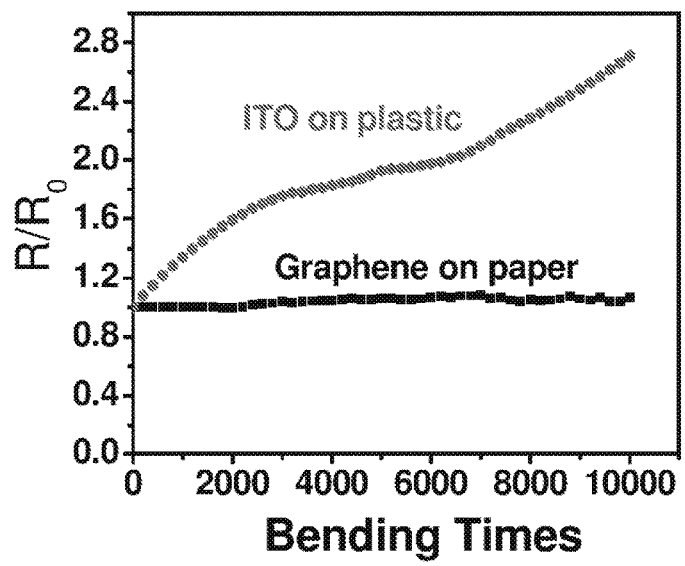
Fig. 33 Touch screen fatigue test with a bending radius 3 mm. The relative change of resistance after 10,000 bending test is minimum compared with ITO/plastic.

Touch screen tests
The multi-touch screen was fully characterized with commercial tools developed by 2D Carbon Tech Co., LTD. Live demonstration of touch screen can be found in Video 2.
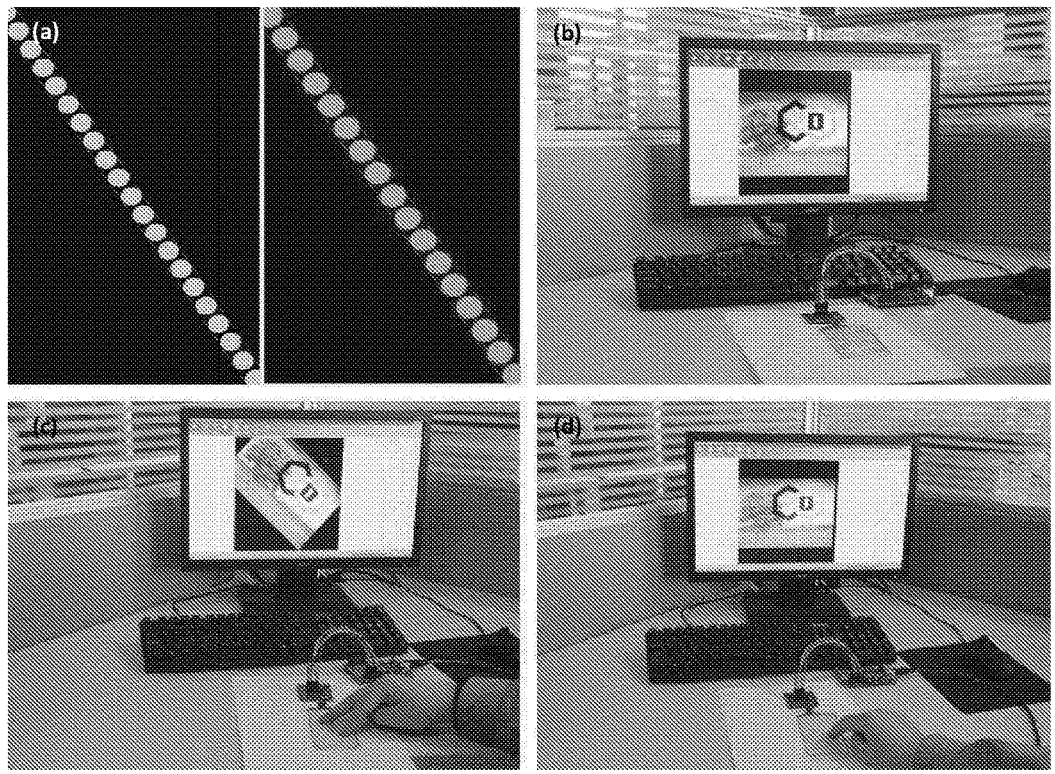
Fig. 34 Pictures of (a) Linearity test; (b) Touch screen test set up; (c) Testing the operation of 'rotation'. (d) Testing the operation of 'drawing'.

SUPER CLEAR CELLULOSE PAPER

CROSS-REFERENCE TO RELATED PATENT APPLICATION

This is a continuation-in-part application co-pending with the U.S. patent application Ser. No. 14/563,387, filed on Dec. 8, 2014, which claims priority from U.S. provisional patent application 61/912,923 filed on Dec. 6, 2013, all assigned to common assignee and are incorporated herein in their entireties by reference. This application claims priority from U.S. provisional patent application 62/199,372 filed on Jul. 31, 2015, the content of which are hereby incorporated by reference into this application.

BACKGROUND OF THE INVENTION

Traditional ways to produce transparent paper involve fiber-based and sheet processing techniques. Fiber-based methods use overbeaten wood pulp, while sheet processing requires coating, impregnating, supercalendering, or chemical immersion to produce transparent paper. These methods consume large amounts of energy or rely on petroleum-based materials to produce paper with no more than 80% transmittance. Since Herrick and Turbak successfully separated nanofibers from wood pulp using a mechanical process in a high pressure homogenizer in 1983, cellulose nanofibers have attracted great attention because they can be used to manufacture transparent paper for printed electronics, opto-electronic devices, and also for packaging. Related art transparent paper is made of NFCs (nanofibrillated cellulose) which involves a fabrication process that is too time and energy consuming to be practical for commercial applications.

Some related art techniques are used to liberate nanofibers. These techniques include mechanical treatments and acid hydrolysis. Mechanical treatment techniques are currently considered efficient ways to isolate nanofibers from the cell wall of a wood fiber. However, solely mechanical processes consume large amounts of energy and insufficiently liberate the nanofibers while damaging the microfibril structures in the process. Pretreatments, therefore, are conducted before conducting mechanical disintegration in order to effectively separate the fibers and minimize the damage to the nanofiber structures.

TEMPO-mediated oxidation is proven to be an efficient way to weaken the interfibrillar hydrogen bonds that facilitate the disintegration of wood fibers into individualized nanofibers yet maintain a high yield of solid material. Nanopaper made of nanofibers can attain a transmittance of over 80%, yet this type of transparent paper takes a longer time to fabricate and has a very low haze.

Solar cell substrates require high optical transparency, but also prefer high optical haze to increase the light scattering and consequently the absorption in the active materials. Common transparent paper substrates generally possess only one of these optical properties, which is exemplified by common transparent paper substrates exhibiting a transparency of about 90% yet a low optical haze of <20%.

Substrates play a key role as to the foundation for opto-electronic devices. Mechanical strength, optical transparency, and maximum processing temperature, are among the critical properties of these substrates that determine its eligibility for various applications. The optoelectronic device industry predominantly utilizes glass substrates and plastic substrates for flexible electronics; however, recent reports demonstrate transparent nanopaper based on renewable cellulose nanofibers that may replace plastic substrates in many electronic and optoelectronic devices. Nanopaper is entirely more environmentally friendly than plastic substrates due to its composition of natural materials; meanwhile it introduces new functionalities due to NFCs' fibrous structure.

The maximum transparency among all current reports on glass, plastic, and nanopaper substrates is about 90%, but with a very low optical haze (<20%). Optical haze quantifies the percent of the transmitted light that diffusely scatters, which is preferable in solar cell applications. Optical transparency and haze are inversely proportional values in various papers. Trace paper has a high optical haze of over 50%, but a transparency of less than 80%; whereas plastic has a transparency of about 90%, but with an optical haze of less than 1%. Related art Nanopaper based on NFCs has the highest reported optical haze among transparent substrates due to its nanoporous structure, yet it is still a relatively low value.

Although optical haze is a property preferably maximized in transparent substrates integrated into solar devices, other optoelectronic devices require different levels of light scattering; for example, displays and touch screens need high clarity and low optical haze. Plastic substrates have been widely used as a flexible material for packaging, electronics and other applications. Transparent paper was recently demonstrated, but the optical haze is too large for most of the optoelectronics applications. In devices such as organic light emitting diodes, liquid crystal display TVS and others, the optical haze has to be less than 1%. Transparent paper developed before has an optical haze >10%, which is too high for the above-mention applications.

Current commercial substrates are best suited for displays, but are not optimized for solar cell devices because of the low optical haze. Various materials such as $SiO_2$ nanoparticles or silver nanowires are reported to effectively increase light absorption and consequentially the short-circuit current by enhancing the path of light through the active solar layer with increased diffuse light scattering. The light scattering induced by these nanostructures is limited, however, and incorporating these materials requires additional steps that add cost to the solar cells devices.

SUMMARY OF THE INVENTION

The inventors of the present application have developed a method of making a transparent paper based on wood fibers, which has an ultra-high optical transparency (~96%) and simultaneously an ultra-high optical haze (~60%). The primary wood fibers are processed by using a TEMPO/NaBr/NaClO oxidization system to introduce carboxyl groups into the cellulose. This process weakens the hydrogen bonds between the cellulose fibrils, and causes the wood fibers to swell up and collapse resulting in a high packing density and excellent optical properties. The advantages of this invention is that it exhibits a dramatic dual improvement on the optical transmittance and optical haze; and it is formed from much less energy intensive processes that enable low cost paper devices. The optical properties allow a simple light-management strategy for improving solar cell performances. This is demonstrated with an organic solar cell by simply laminating a piece of such transparent paper, and observed its power conversion efficiency (PCE) increased from 5.34% to 5.88%. Transparent paper with an optical transmittance of ~96% and transmittance haze of ~60% is most suitable for solar cell applications.

The inventors of the present invention are also the first to demonstrate that large light scattering tuning can be achieved in mesoporous paper for photonics and optoelectronics by simply changing the packing of the cellulose fibers. In one extreme, we achieved >90% total transmittance and <1% optical haze, when cellulose nanofibers are densely packed through layer by layer. In the other extreme, we achieved >90% total transmittance and >90% light scattering when the microfibers are in situ nano-welded in ionic liquid. We conducted a detailed investigation of the 3D surface topology of mesoporous cellulose paper. This 3D topology investigation supports a full spectrum simulation that may guide future designs of transparent paper with tunable light scattering. A 2.5 by 4 inch touchscreen (multi-touch) is demonstrated using dry-transferred graphene as a transparent conductor on super clear paper. Mesoporous transparent paper with tailored optical properties can be applied to a range of devices resulting in an enhanced performance. Meanwhile, such super clear paper shows complete process compatible with roll-to-roll manufacturing in flexible electronic, which is critical for future system integrations for all paper photonics and optoelectronics systems.

BRIEF DESCRIPTION OF THE DRAWINGS

The above and/or other aspects of the present invention will be more apparent by describing in detail exemplary embodiments thereof, with reference to the accompanying drawings in which:

FIG. 1 (b) shows a related art regular paper.

FIG. 1 (c) shows transparent paper made of TEMPO-oxidized wood fibers.

FIG. 1 (e) shows TEMPO-oxidized cellulose with carboxyl groups in the C6 position.

FIG. 2 (e) shows a digital image of transparent paper produced from TEMPO-oxidized wood fibers with a diameter of 20 cm.

FIG. 3 (b) shows a graph of the transmission haze vs. wavelength.

FIG. 3 (c) shows the transmission haze of transparent paper with varying thicknesses at 550 nm.

FIG. 3 (d) shows optical transmission haze vs. transmittance for different substrates at 550 nm. Glass and PET plastics are in the green area, in which are suitable for displays due to their low haze and high transparency; transparent paper developed embodied by this invention are located in the cyan area is the most suitable for solar cells.

FIG. 4 (e) shows MD simulation of two TEMPO-oxidized wood fibers.

FIG. 4 (f) shows a graph of variation of potential energy of the model systems as a function of relative sliding displacement for FIGS. 4(d) and (e).

FIG. 9 shows the total optical transmittance of transparent paper with varying thicknesses.

FIG. 10(c) pulling force needed to drive the sliding as a function of relative sliding displacement for both cases.

FIG. 11 shows scattering angular distribution with an arbitrary y-axis unit for transparent paper and nanopaper

FIG. 13 shows the light absorption of TEMPO-oxidized wood fibers deposited on a silicon slab.

FIG. 14 shows the molecular structure of PCDTBT (a) and PC70BM (b) used in OPV devices.

FIG. 15a-FIG. 15h shows the hierarchical structure of tree and the applications of natural fibers with different fiber diameter. Images of (a) tree and (b) wood trunk. (c) SEM image of porous and fibrous structure of wood. (d) Hierarchical structure of wood microfiber, where each microfiber is composed of a nanofibers. (e) Schematic and (f) picture of super transparent and super hazy paper made of partly dissolved and nanowelded microfibers. The total transmittance of hazy paper is >90%, and the transmission haze is >90%. (g) Schematic and (h) picture of super transparent and super clear paper made of nanofibers. The total transmittance of super clear paper is >90%, and the transmission haze is <1%.

FIG. 16a-FIG. 16e shows super clear paper made of CNF exhibits excellent optical properties and small surface roughness. (a) AFM image of purified CNF with a uniform diameter. (b) Picture of super clear paper substrate. Comparison of total forward transmittance (c) and (d) transmittance haze for clear paper, flexible glass and PET plastic. (e) AFM height image and AFM line scan of transparent paper with scan size 8 μm*8 μm.

FIG. 17a-FIG. 17d shows super haze paper fabricated by nanowelding exhibits excellent optical properties and surface roughness. (a) In-situ pressing the ionic liquid treated paper turns a regular paper to a highly transparent and hazy paper. (b) AFM phase image with a size of 8 μm*8 μm showing the surface morphology of super hazy paper. Comparison of total forward transmittance (c) and transmittance haze (d) for super hazy paper, flexible glass, and PET.

FIG. 21a-FIG. 21d shows light scattering effect of transparent and hazy paper, and its potential applications. (a) Angular distribution of forward light scattering in transparent paper with ultra-high haze; (b) Schematic showing forward light from OLED was scattered by transparent paper with ultra-high haze; (c) Iwatch with glare effect; (d) Iwatch with transparent and hazy paper shows anti-glare effect.

FIG. 25 shows an experiment diagram of diffusion scattering angular test.

FIG. 26 shows an angular distribution of forwarded light scattering of transparent and super clear paper.

FIG. 28 shows an AFM phase image of super clear paper with scan area of 500 nm*500 nm to 8 μm*8 μm. Nanofiber morphology is clearly presented.

FIG. 29 shows an AFM phase image of super hazy paper with a scan area from 500 nm*500 nm to 8 μm*8 μm. Both remained microfiber backbone and dissolved nanofiber are clearly observed.

FIG. 30a-FIG. 30b shows (a) the layer-by-layer structure clearly seen in the zoom in image and (b) the view of the large fiber backbone remained in the super hazy paper FIG. 31a-FIG. 31b shows (a) BET-BJH pore distribution of regular paper. Inset shows the pore distribution at 2-10 nm; and (b) Cross section SEM image of regular paper showing large pores.

FIG. 32a-FIG. 32b shows (a) schematic to show the alser cutting graphene on the super clear paper and (b) a picture of laser cutting device. The red dot shows the position of infrared laser.

FIG. 33 shows a touch screen fatigue test with a bending radius of 3 mm. The relative change of resistance after 10,000 bending test is minimum compared with ITO/plastic.

FIG. 34a-FIG. 34d shows pictures of (a) linearity test; (b) touch screen test set up; (c) testing the operation of 'rotation' and (d) testing the operation of 'drawing'.

DETAILED DESCRIPTION OF THE INVENTION

Figure 1B:
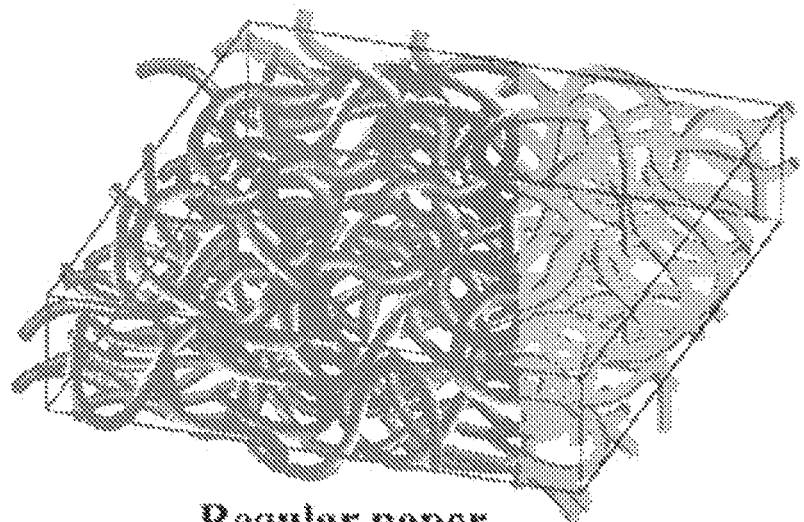
FIG. 1 (a) shows a Hierarchical structure of a tree and the conversion to elementary fibrils.
FIG. 1(d) shows molecular structure of cellulose.
Figure 1C:
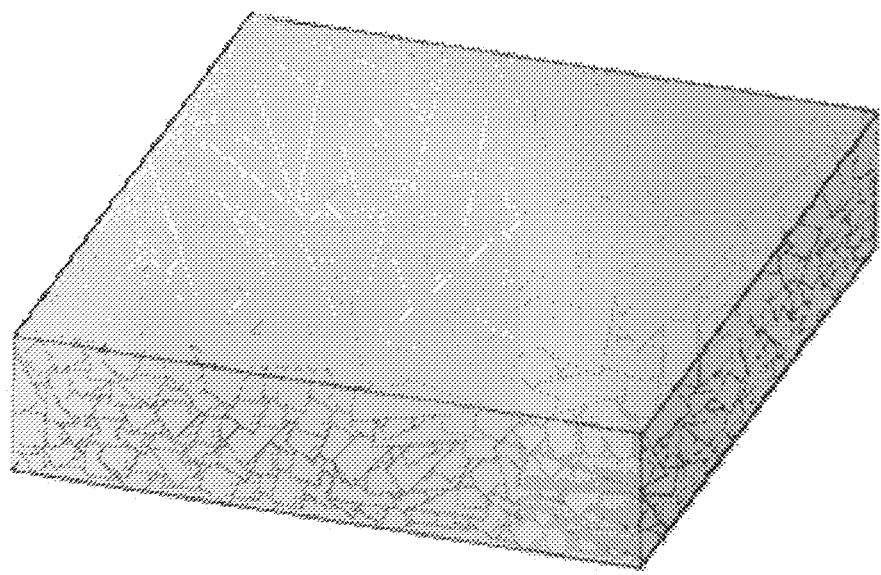

The invention relates to a method of making a transparent paper substrate made of earth-abundant wood fibers that simultaneously achieves an ultra-high transmittance (~96%) and ultra-high optical haze (~60%), and its optimal application on the solar cells with a PCE enhancement of 10% by a simple lamination process. The modified wood pulp with high fragment content and fewer hollow structures lead to a higher packing density, which dramatically increases both the optical transmittance and mechanical strength of our transparent paper compared to regular paper. The transparent paper demonstrates a much higher optical transmittance than nanopaper made of nanoscale fibers while using much less energy and time to process paper with a similar thickness. Such low-cost, highly transparent, and high haze paper can be utilized as an excellent film to enhance light-trapping properties for photovoltaic applications such as solar panel, solar roof, or solar windows. Transparent paper is made of mesoscale fibers. The primary fibers have an average diameter of ~26 μm.

The highly transparent paper has a high haze based on TEMPO-oxidized micro-sized wood fibers, plus an efficient and economic approach to improve the light absorption of a silicon slab is presented by applying a layer of TEMPO-treated wood fibers or by laminating a piece of highly transparent paper onto the surface. This approach to produce highly transparent paper with high haze using micro-sized wood fibers has the potential to be scaled up to industrial manufacturing levels, which is crucial for commercial applications. The wood fibers are processed by using a TEMPO/NaBr/NaClO oxidization system to introduce carboxyl groups into the C6 positions of the cellulose. This process weakens the bonds between the cellulose fibrils and causes the wood fibers to swell up. The oxidized wood fibers are then fabricated into highly transparent paper. The transparent paper requires less time to fabricate than nanopaper due to the use of micro-sized wood fibers, and it achieves both higher transmittance and higher haze. The treated wood fibers and fabricated transparent paper are applied on the surface of a silicon slab by coating and lamination, separately. A significant enhancement in the light absorption of a silicon slab is observed for both methods.

Wood fibers extracted from trees by chemical processes and mechanical treatments are the main building blocks of paper and consist of millions of microfibrils (nanofibers) with a diameter ranging from 5 nm to 20 nm mainly distributing in the S2 layer of cell wall. The primary wood fibers are processed by using a TEMPO/NaBr/NaClO oxidization system to introduce carboxyl groups into the cellulose.

Natural biomaterials are renewable and environmentally friendly materials that encourage the development of a sustainable human society. Cellulose is the most abundant renewable organic polymer on the earth that is primarily extracted from plants and composed of repeating anhydrogluclose links through β-1,4-glucosidic bonds. The TEMPO/NaBr/NaClO oxidation system weakens the hydrogen bonds between the cellulose fibrils, and causes the wood fibers to swell up and collapse resulting in a high packing density and excellent optical properties.

About 30-40 individual linear cellulose chains are assembled together into elementary fibrils 1.5-3.5 nm wide, and these elementary fibrils are hierarchically structured into a macroscopic structure, such as microfibrils (10-30 nm) or microfibrillar bands (~100 nm).[3] Microfibrillar bands are organized into the cell wall of wood fiber.[4] Wood fibers have a slender, hollow, and hierarchical structure that is approximately 10-50 lam wide and several millimeters long. These properties enable the paper to have its three dimensional structure, tailored optical properties, and tunable porosity. The structure of cellulose includes hydroxyl, ether, carbon-carbon, and carbon-hydrogen bonds that do not absorb light in the visible range;[2] consequently, pure cellulose is colorless. Although wood fibers consist of 85-95% cellulose after digesting and bleaching, the fibers' hollow structure prevents optical transparency due to light scattering that occurs in the interfacial area between the dense cell walls and the air present within the micro-sized cavities. Paper made of wood fibers also appears opaque due to the light scattering behavior from the porosity of the wood fiber network.

Transmission haze refers to the percentage of light diffusely scattered through a transparent surface from the total light transmitted. Higher transmission haze improves the light absorption efficiency of solar cells from the increased path of light transmitted into the active layer, resulting in an enhanced short circuit current density Optical haze quantifies the percent of the transmitted light that diffusely scatters, which is preferable in solar cell applications.

Figure 1D:
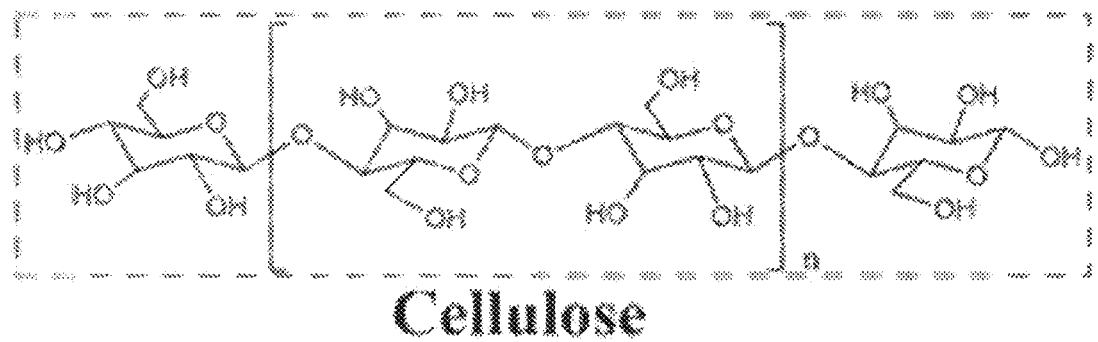
Figure 1E:
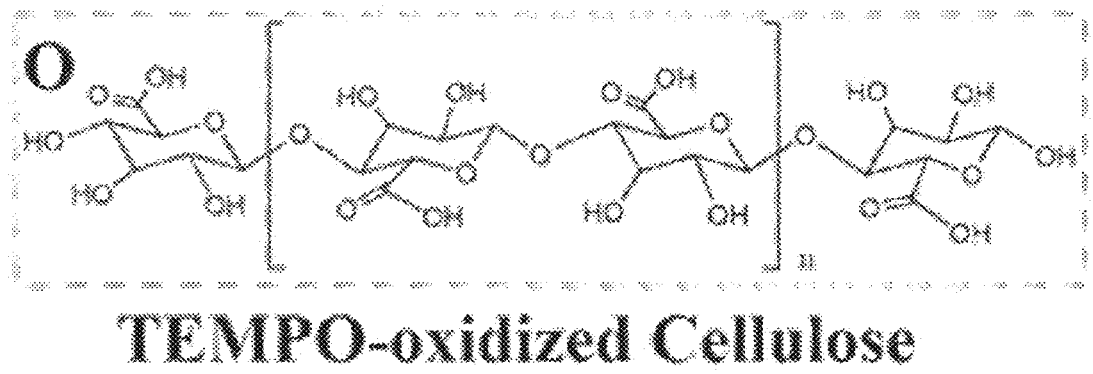

FIG. 1a. is a hierarchical structure of a tree. A schematic of cellulose and paper before and after TEMPO-mediated oxidation is portrayed. As shown in FIG. 1, the TEMPO/NaBr/NaClO system was used to modify the surface properties of the pristine wood fibers by selectively oxidizing the C6 hydroxyl groups of glucose (left bottom in FIG. 1b) into carboxyl groups under aqueous conditions (right bottom in FIG. 1c). The repulsive force resulting from additional higher negative charges at the surface of the nanofibers loosens the interfibrillar hydrogen bonds between the cellulose nanofibers resulting in the fiber cell walls are significantly open and crush. Regular paper with micro-sized wood fibers has limited optical transparency due to the many micro-cavities existing within the porous structure that cause light scattering (top left in FIG. 1b) Eliminating these pores is the primary direction to improve the optical transmittance of paper. Many approaches based on the above mechanism are used to produce transparent paper involving fiber-based and sheet processing techniques. Regular paper is a porous structure composed of untreated wood fibers with an average width of ~27 μm (top left in FIG. 1b); however paper made from TEMPO-oxidized wood fibers with an average width of approximately 26 μm displays a more densely packed configuration (top left FIG. 1c). The morphology of wood fibers plays a significant role in producing highly transparent paper, hence fiber morphological analysis of TEMPO-treated wood fibers was conducted for explaining the high packing density of transparent paper made from TEMPO-oxidized micro-sized wood fibers. FIG. 1d shows the hydro bonds between the cellulose chains. FIG. 1e shows TEMPO-oxidized Cellulose.

FIG. 2 portrays the morphology of original bleached sulfate wood fibers under an optical microscope. FIGS. 2a and 2b portray the significant morphological changes in the dimensions of the wood fibers before and after TEMPO treatment was conducted for 10 h at a stirring speed of 1000 rpm. Compared to the original fibers, the TEMPO-oxidized fibers swelled such that the width of the fibers expanded while the length decreased. FIGS. 2c and 8d indicate that most fibers are cleaved and unzipped in the axial direction, and the degree of polymerization of the cellulose decreases. FIGS. 2d and 8d show the configuration of cellulose nanofibers on the cell wall of wood fibers revealing portion of cellulose nanofiber were removed from the primary layer of cell wall during the TEMPO treatment due to weak interfibrillar hydrogen bonds. As seen in Table 1, the average length of the wood fibers dramatically decreased from 1.98 mm to 0.71 mm after the TEMPO treatment, and there was a slight reduction in the average width and an enormous increase in fines from 5.90% to 18.68%.

TABLE 1

Dimension of wood fibers before and after TEMPO oxidization

|  | Average length (mm) | Average width (μm) | Fine content (%) |
|---|---|---|---|
| Pristine fibers | 1.98 | 27.25 | 5.90 |
| TEMPO-oxidized fibers | 0.71 | 25.79 | 18.68 |

Figure 2A:
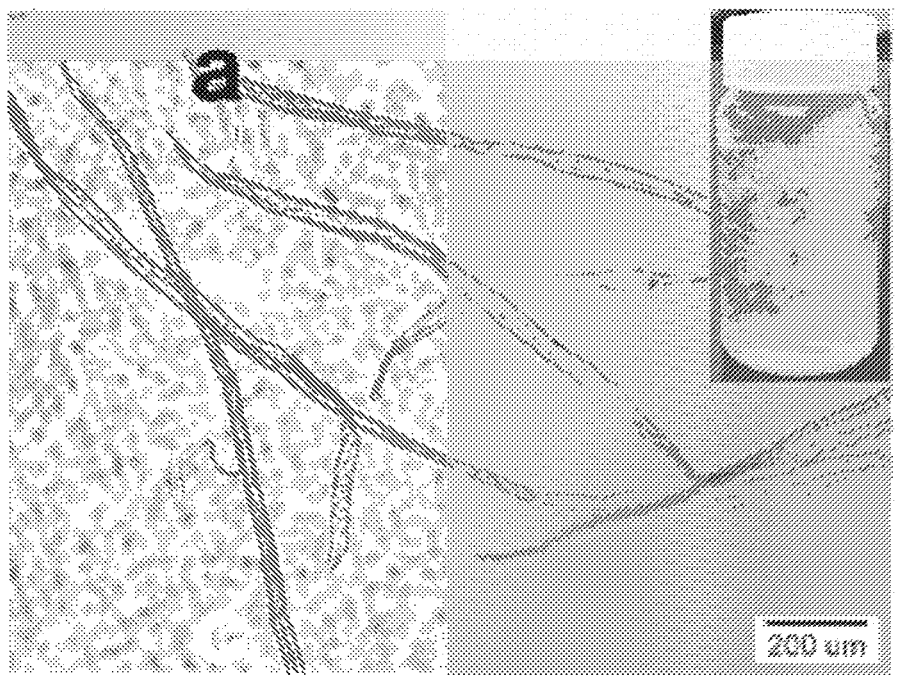
FIG. 2 (a) shows the morphology of original bleached sulfate wood fibers under an optical microscope. The inset is a 0.25 wt % original bleached sulfate wood pulp suspension.
FIG. 2(b) shows the morphology of TEMPO-oxidized wood fibers under an optical microscope. Inset is a 0.25 wt % TEMPO-oxidized wood fiber suspension.
FIG. 2(c) shows SEM images of unzipped TEMPO-oxidized wood fibers.
FIG. 2(d) shows nanofibers on the cell wall of TEMPO-oxidized wood fiber.
Figure 2B:
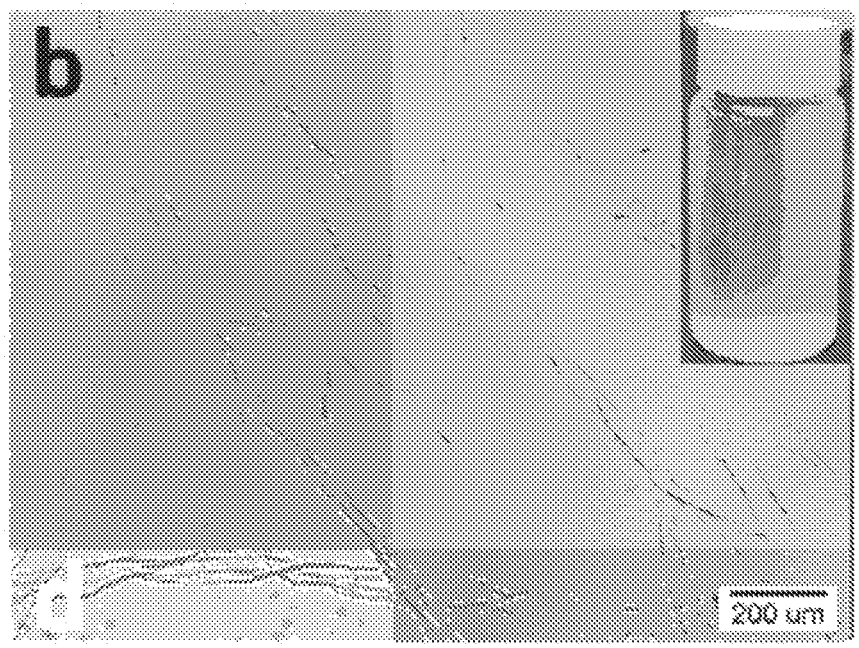
Figure 2C:
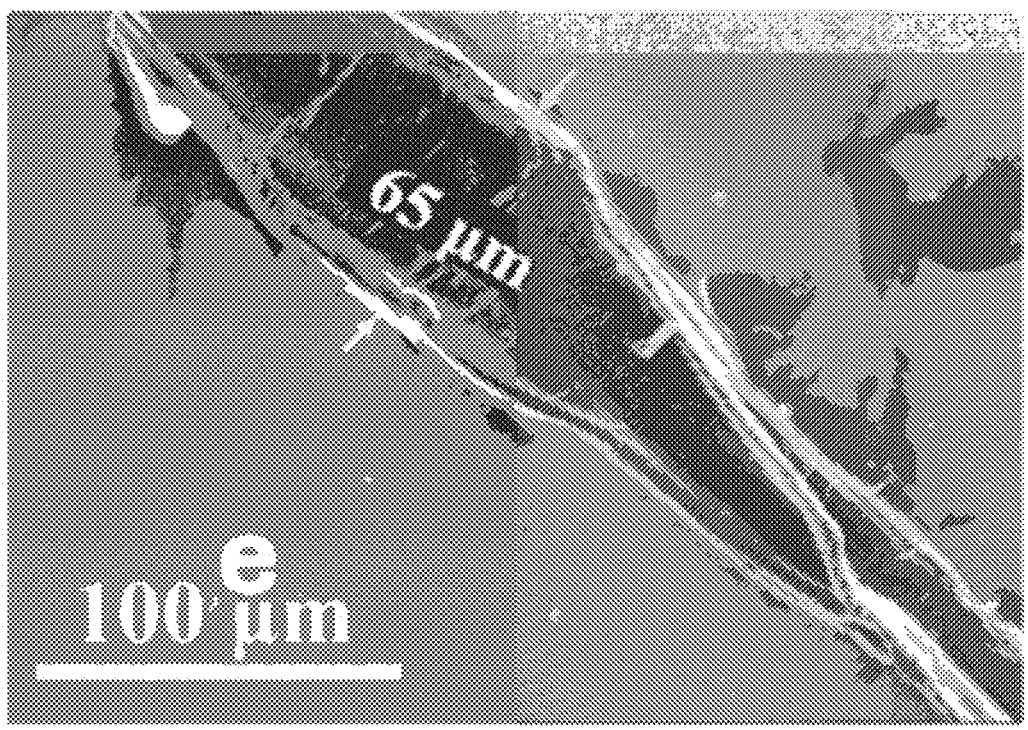
Figure 2D:
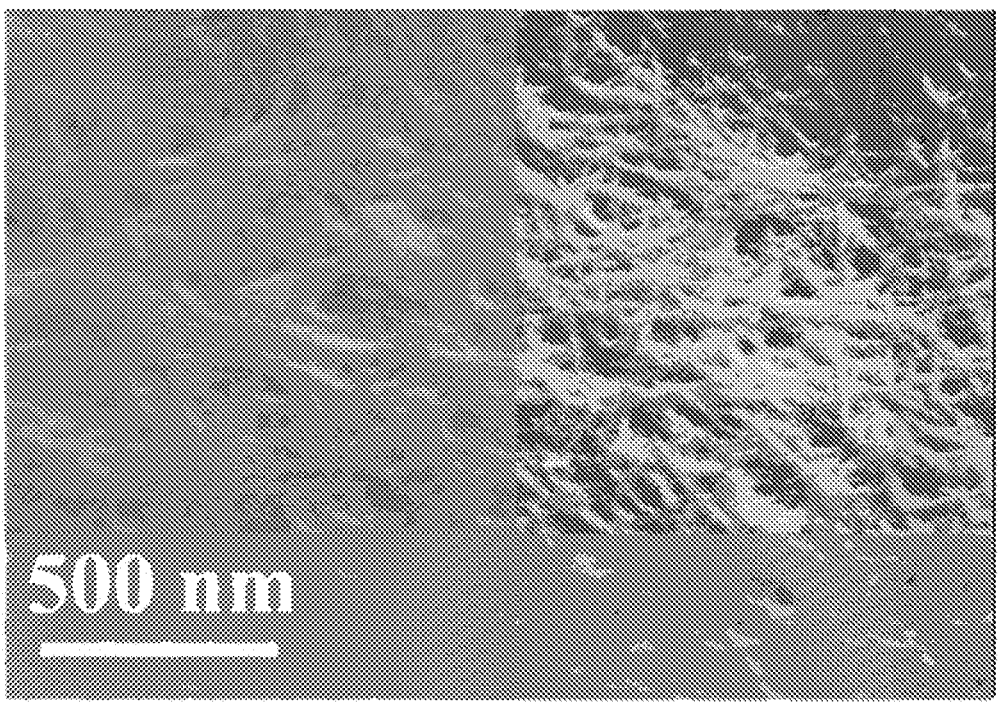
Figure 2E:
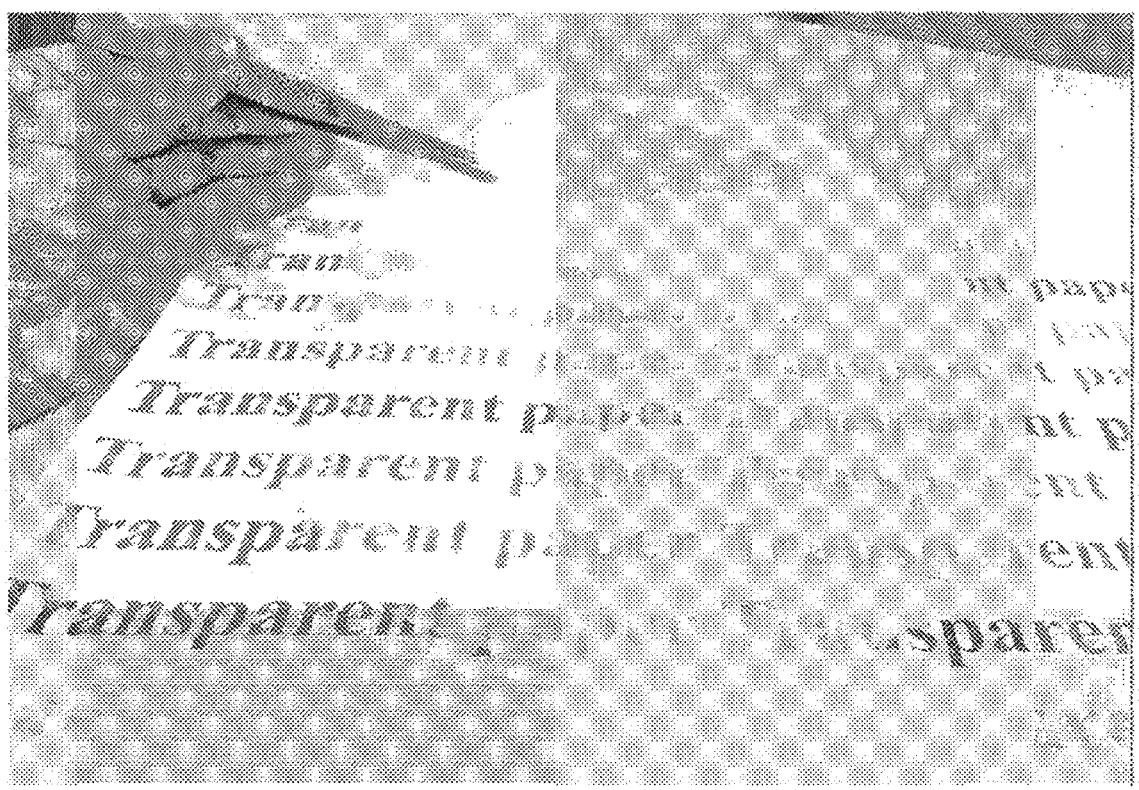

FIGS. 2a and 2b indicate how TEMPO-oxidized wood pulp with a concentration of 0.25% (by weight) shows a more homogeneous and transparent appearance than the original wood pulp with the same consistency. FIG. 2e shows how increased fines, reduced fiber lengths, and crushed and unzipped TEMPO-oxidized fibers tend to form denser fiber network during fabrication that perpetuates high optical transmittance. The "transparent paper" seen in FIG. 2 refers to paper produced from the TEMPO-oxidized wood fibers and it exhibits an excellent transmittance.

Table 1 portrays a highly transparent paper with high haze that was fabricated with obtained TEMPO-oxidized micro-sized wood fibers by vacuum filtration showing a considerable reduction of filtration time and energy.

Figure 3A:
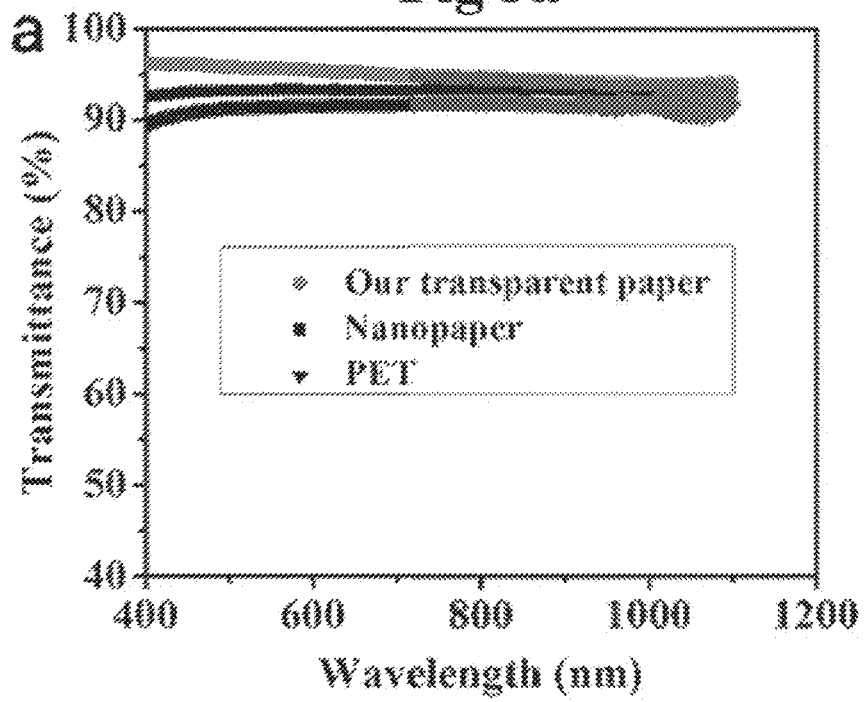
FIG. 3. (a) shows a graph of the total optical transmittance vs. wavelength measured with an integrating sphere setup.

The filtration time for transparent paper with a thickness of 50 μm is generally less than 1 hour, however, it will take at least 8 hours to filter a piece of nanopaper with a similar thickness using 5~30 nm wide TEMPO-oxidized nanofibers under the same conditions. The total light transmittance of transparent paper, nanopaper, and PET (polyethylene terephthalate) is compared in FIG. 3a and the basic information of the two types of paper is shown in Table S1.

TABLE S1

Mass and thickness of paper

|  | Mass (g/m²) | Thickness (μm) |
|---|---|---|
| Nanopaper | 33 | 32 |
| Transparent paper | 50 | 44 |

According to this data, transparent paper has the highest optical transmittance compared to nanopaper and PET.

FIG. 3 shows optical properties of our transparent paper, nanopaper, and PET. Highly transparent paper with high haze was fabricated with obtained TEMPO-oxidized micro-sized wood fibers by vacuum filtration showing a considerable reduction of filtration time and energy. The filtration time for transparent paper with a thickness of 50 μm is generally less than 1 hour, however, it will take at least 8 hours to filter a piece of nanopaper with a similar thickness using 5~30 nm wide TEMPO-oxidized nanofibers under the same conditions. The total light transmittance of transparent paper, nanopaper, and PET (polyethylene terephthalate) is compared in FIG. 3a and the basic information of the two types of paper is shown in Table S1.

According to this data, transparent paper has the highest optical transmittance compared to nanopaper and PET.

Figure 3B:
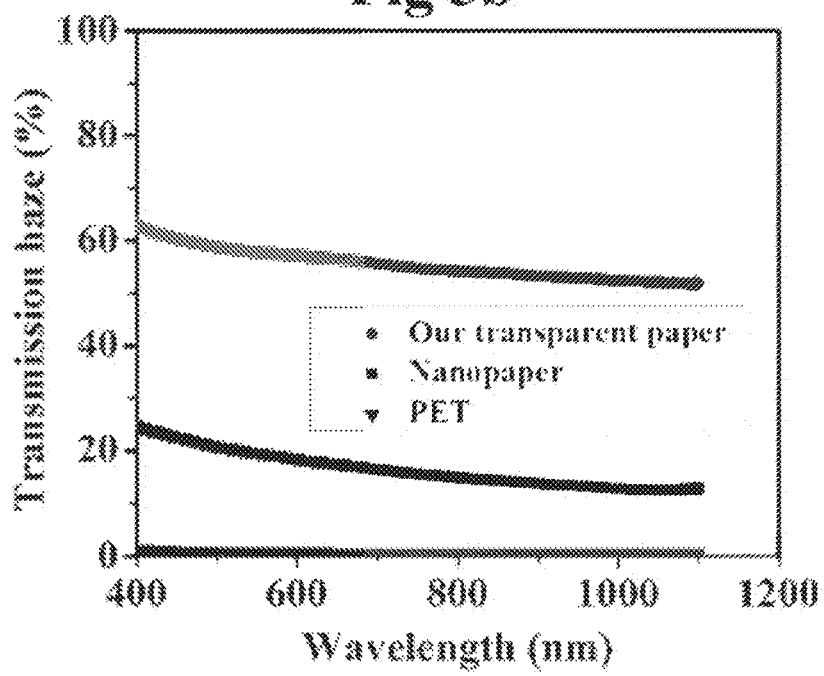

FIG. 3b. depicts the wavelength vs. transmission haze as plotted. Transmission haze is an important optical property for optoelectronic devices, and refers to the percentage of light diffusely scattered through a transparent surface from the total light transmitted. For the transparent paper in this work, a transmission haze over 50% is demonstrated while maintaining a transmittance of over 90%. Additionally, the transmission haze and the optical transmittance of transparent paper are also determined by the paper thickness. Higher transmission haze improves the light absorption efficiency of solar cells from the increased path of light transmitted into the active layer, resulting in an enhanced short circuit current density.

Figure 3C:
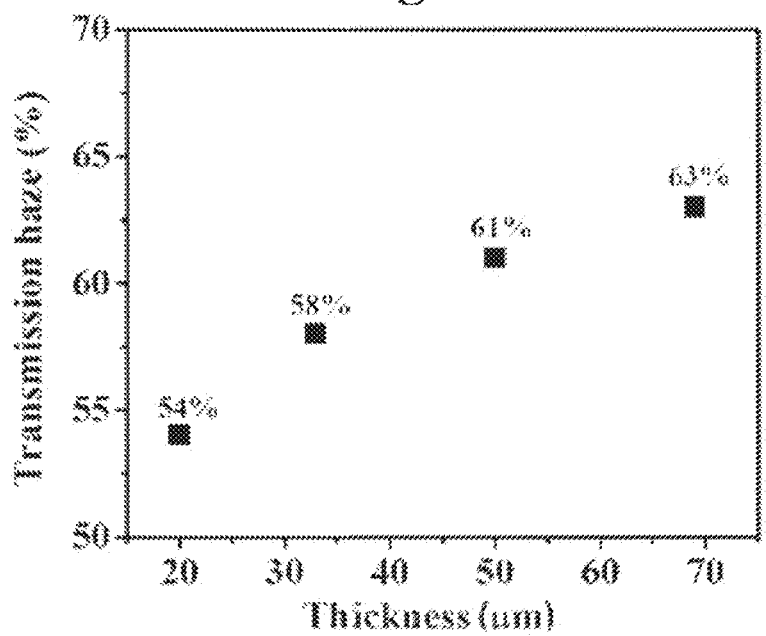

FIG. 3c shows how the transmission haze tends to increase with an increase in paper thickness while the optical transmittance increases slightly with a decrease in paper thickness (FIG. 9 and Table S2).

TABLE S2

Mass and thickness of transparent paper with oxidized wood fibers

|  | Mass (g/m²) | Thickness (μm) |
|---|---|---|
| 1 | 81 | 69 |
| 2 | 63 | 50 |
| 3 | 37 | 33 |
| 4 | 20 | 20 |

It is critical to combine the optical haze and transmittance for substrates toward different applications. The performance of optical transmittance vs. wavelength of substrates has been widely investigated; but the optical haze is largely ignored as most substrates have a much lower optical haze (<1%).

Figure 3D:
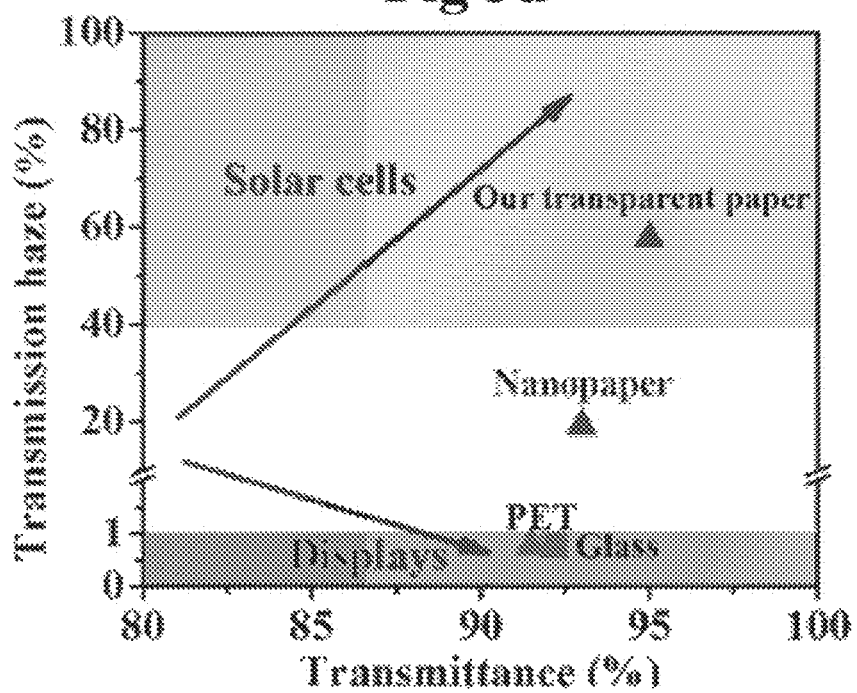

As shown in FIG. 3d, a high clarity for substrates is crucial for displays. Glass and plastic substrates all meet this requirement. Recently developed nanopaper has an optical haze of 15-20%, which is too high for display applications, but it is more suitable for solar cells. Note some outdoor displays also requires substrates with a high haze to avoid glare effect in sunlight. All these substrates have an optical transmittance of ~90%. Our transparent paper has an optical transmittance of ~96% and transmittance haze of ~60%, which is the most suitable substrate for solar cell applications.

Figure 4A:
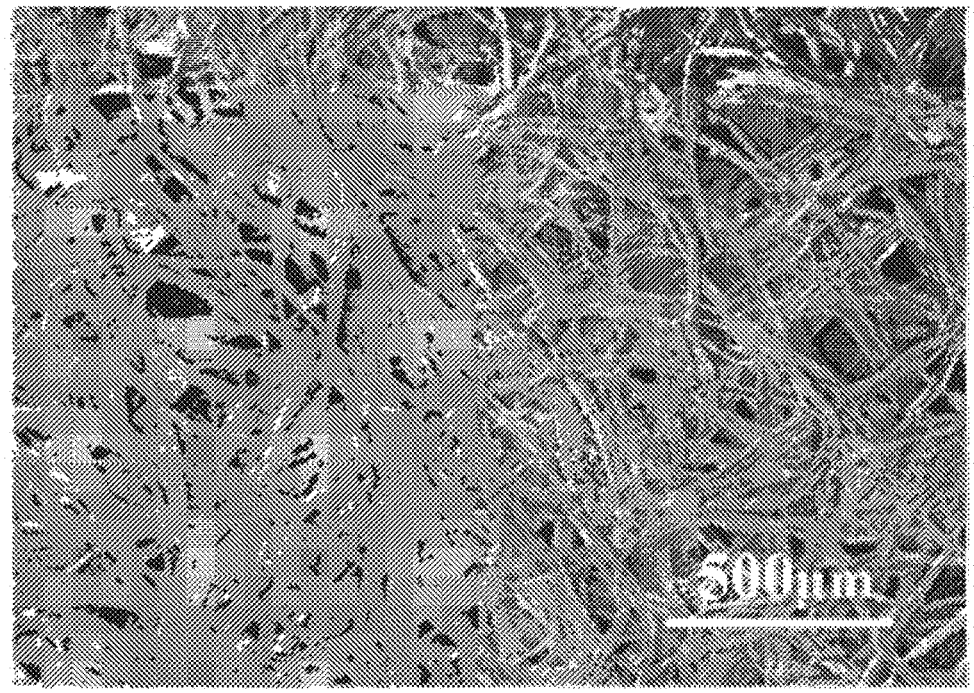
FIG. 4 (a) shows an SEM image of a regular paper.
FIG. 4(b) shows an SEM image of a transparent paper.
FIG. 4(c) Shows a graph of the tensile strength of transparent paper according an embodiment of the invention and regular paper.
FIG. 4(d) shows MD simulation model of inter-sliding of two related art wood fibers.
Figure 4B:
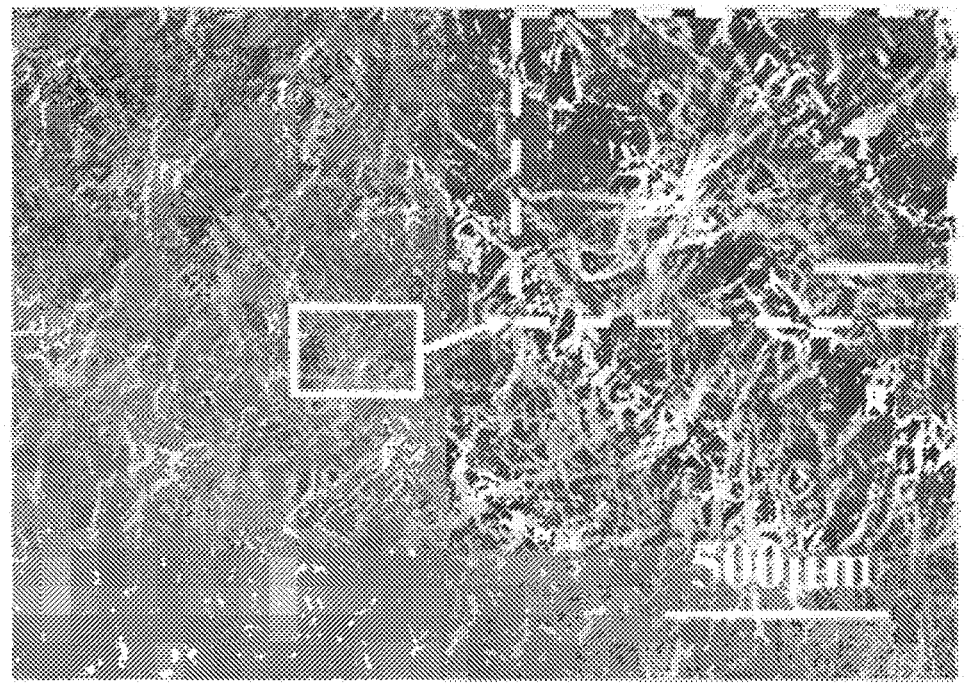

FIGS. 4a and 4b show SEM images taken to study the morphology of regular paper and transparent paper. These images were taken to further explore why our transparent paper exhibit the highest transmittance. Although the cylindrical wood fibers within the regular paper collapse during pressing and drying, there are plenty of cavities that form throughout the network of micro-sized fibers causing enhanced light scattering behavior due to the refractive index mismatch between cellulose (1.5) and air (1.0). In FIG. 4b, a homogenous and more conformal surface is observed due to the collapse of the TEMPO-oxidized wood fibers. There is a significant amount of small fragments in the pulp that fill in the voids within the paper (see the insert in FIG. 4b). This causes less light scattering to occur within the TEMPO treated paper allowing more light to pass through it.

A possible explanation for the transparent paper demonstrating a higher optical transmittance than nanopaper could be that the cell wall of the wood fibers are comprised of a primary and secondary layer with thicknesses of approximately 0.1-0.2 μm and 1-5.5 μm, respectively. The microfibrils are randomly oriented in the primary layer whereas the microfibrils in the secondary layer are helically wound around the fiber axis (see FIG. 1a). Although oxidization effectively weakens the interfibrillar hydrogen bonds between the microfibrils and shortens the fiber length, it only happens within the non-crystalline region and/or on the crystal surfaces of the microfibrils. As a result, the parallel arrangement of microfibrils in the secondary layer is preserved within the cell wall of the wood fibers, giving rise to a higher stacking density (1.14 g/cm3) compared to nanopaper (1.03 g/cm3) made of randomly arranged microfibrils. Transparent paper made of micro-sized fibers, therefore, has better optical transmittance yet consumes much less energy and time for fabrication.

FIG. 4c compares the stress-strain curves of regular paper and transparent paper. The mechanical properties of paper (e.g., toughness, strength) are important for various applications. To test the mechanical properties of the paper, tensile tests of both the transparent paper TEMPO-oxidized wood fibers and regular paper were conducted using the Tinius Olsen H25KT universal testing machine. The comparison shows that the transparent paper is both much stronger (with a tensile strength of ~105 MPa) and much tougher (with a toughness of ~1.88 J/M$^3$) than the regular paper (with a tensile strength of ~8 MPa and a toughness of ~0.15 J/M$^3$).

Such substantial improvements of the mechanical properties of the transparent paper (~13-fold stronger and ~12-fold tougher) find their origin in the enhanced contact area in between nanoscale building blocks of the paper due to TEMPO-treatment, whose effect is twofold: unzipping and cleaving the originally hollow cellulose fibers not only exposes their inner surface to neighboring fibers, but also leads to ribbon-like cellulose flakes and fragments that facilitate higher packing density and more overlapping between neighboring fibers.

The rich hydroxyl groups of the cellulose surface allow facile formation of strong hydrogen bonds. The inter-cellulose-flake bonding in TEMPO-oxidized transparent paper is expected to be consequently much stronger than the inter-cellulose-fiber bonding in regular paper, the physical origin of the substantial improvements in both strength and toughness.

FIGS. 4d and 4e and FIG. 10a, 10b portray molecular dynamic (MD) simulations of scaled-down models for both TEMPO-oxidized fibers and original wood fibers with roughly comparable size. The simulation is based on simplified fiber with uniform dimension, but fiber morphology, fines content, kink index, pigments within paper are some properties that may impact the mechanical strength of paper. The inter-flake (and inter-fiber) sliding and the representative molecular-scale deformation mechanism that leads to the final mechanical failure of the paper were simulated.

Figure 4E:
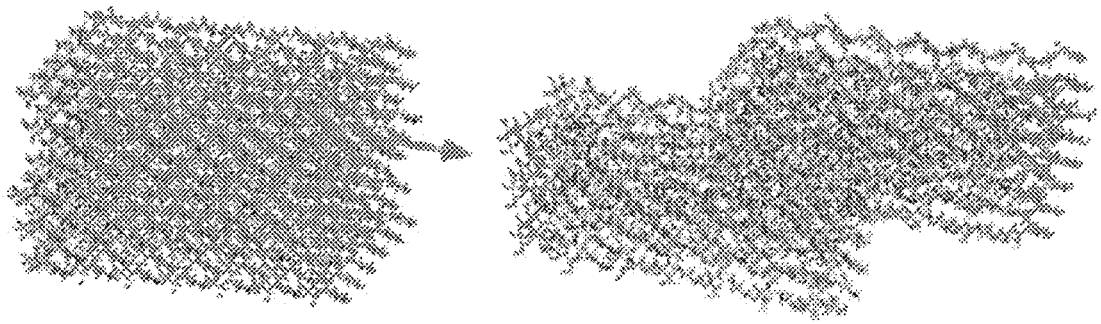
Figure 4F:
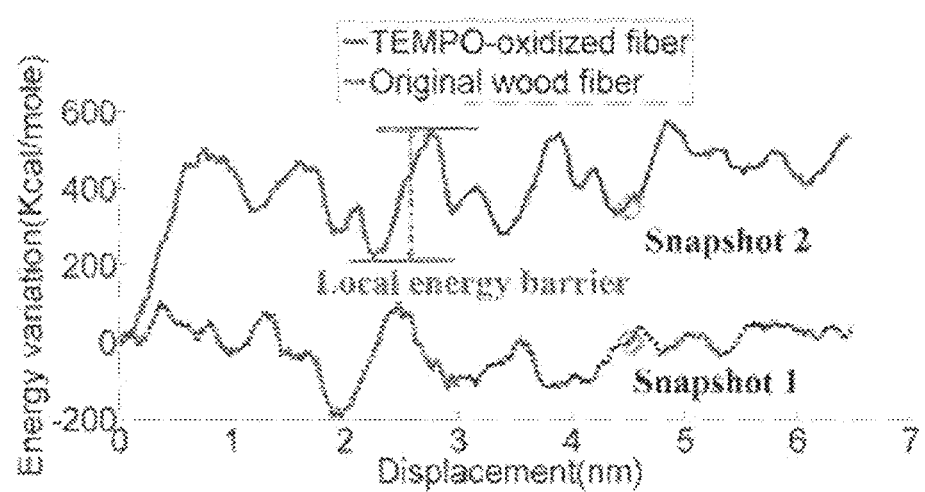

FIG. 4f compares the variation of potential energy as a function of sliding displacement for both cases. The zig-zag nature of the curve denotes the cascade stick-slip events due to breaking and reforming of hydrogen bonds in between two cellulose flakes (or fibers) under sliding displacement. The accumulated energy dissipation, calculated by the sum of all local energy barriers, represents the energy to fracture the neighboring flakes/fibers (i.e., toughness). Comparison in FIG. 4f reveals that the energy needed to separate two flat cellulose flakes is more than 14 times higher than that in the case of two cellulose fibers (~536 kcal/mol vs.~38 kcal/mol), which clearly explains the huge increase in fracture toughness due to TEMPO treatment.

FIG. 10c portrays the resultant force variation as a function of sliding displacement for both cases. The average pulling force necessary to slide the TEMPO-oxidized cellulose flakes (~−284 kcal/mol/Å) is much larger than that in the original cellulose fiber case (−66 kcal/mole/Å). Considering the effective reduction of the cross-sectional area from the hollow cellulose fibers to TEMPO-treated flat flakes, the mechanical strength of TEMPO-oxidized cellulose paper (largest force that can sustain divided per unit cross-section area) is expected to be even higher than that of regular paper, as revealed by the tensile test results.

Figure 5A:
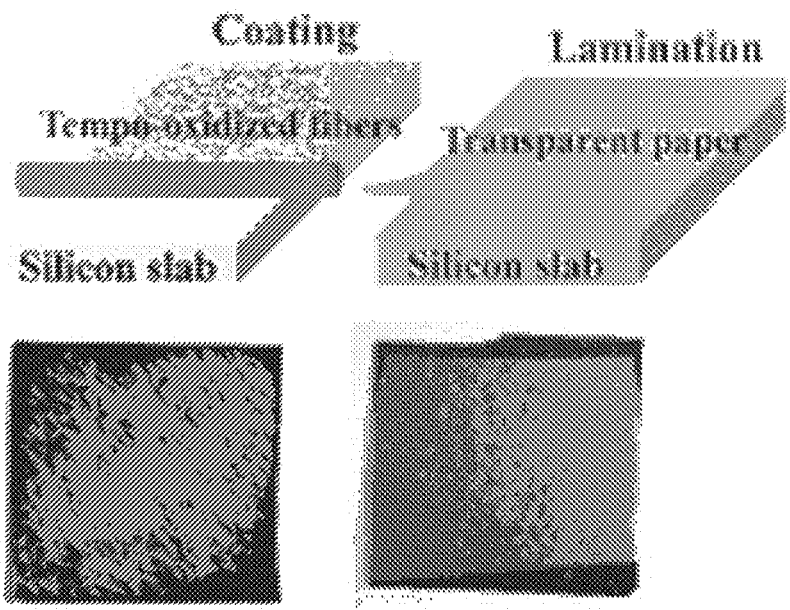
FIG. 5 (a) shows schematics and images of cellulose-deposited silicon slab. Top left: a schematic structure of wood fibers deposited on a silicon slab by Meyer rod coating; top right: a schematic of a transparent paper attached silicon slab by lamination; bottom left: TEMPO-oxidized wood fibers deposited on a silicon slab; bottom right: transparent paper with a thickness of 33 μm attached on a silicon slab.
FIG. 5(b) shows the effective refractive index profiles of the interfaces between air and silicon slab.
FIG. 5(c) shows the effective refractive index profiles of 33 μm cellulose-deposited on a silicon slab.
FIG. 5(d) shows a schematic diagram of transparent paper and its light scattering behavior.
FIG. 5(e) shows a scattering angular distribution with an arbitrary y-axis unit for transparent paper, the maximum scattering angle is 34°.
FIG. 5(f) shows a photo to show the light scattering effect of transparent paper when a laser with a diameter of 0.4 cm passes though transparent paper.
FIG. 5(g) shows the light absorption of transparent paper laminated on a silicon slab.

FIG. 5a shows schematics and images of cellulose-deposited silicon, where the left plots refer to the TEMPO-oxidized wood fiber deposited silicon, and the right diagrams represent transparent paper laminated silicon. Paper with ultra-high transmittance and high transmission haze has potential applications in optoelectronic devices. The light scattering effect of transparent paper can improve the path of light travelling through the active layers of thin film solar cells resulting in an enhanced light absorption. To verify the assumption, TEMPO-oxidized wood fibers are directly coated onto the surface of a silicon slab and transparent paper laminated onto the surface of silicon using NFC as a binder to analyze any resulting enhancement of light absorption in the silicon.

Figure 5B:
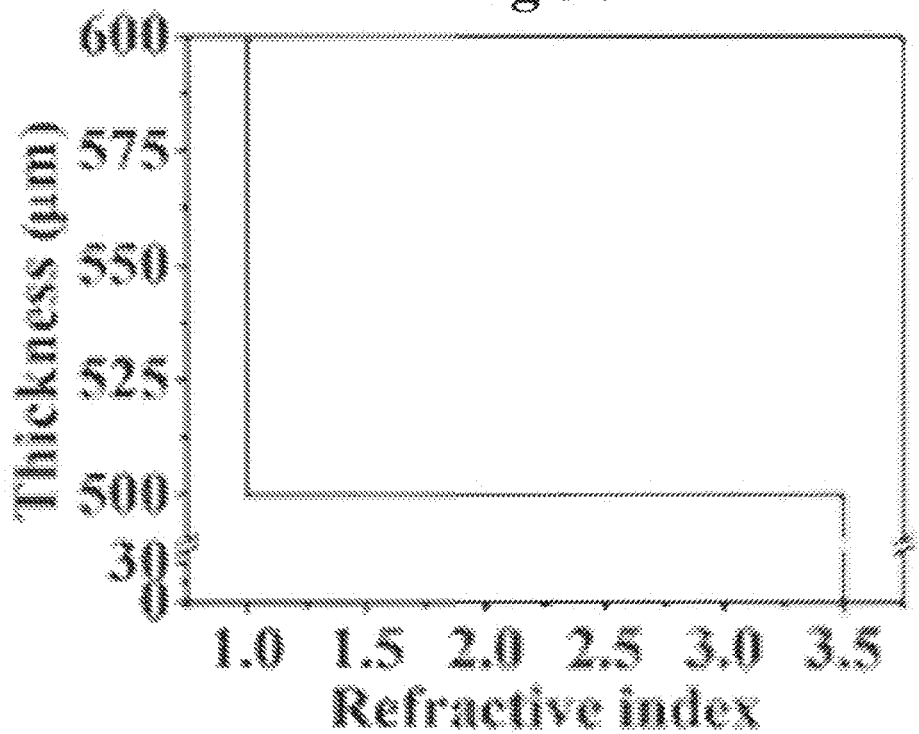
Figure 5C:
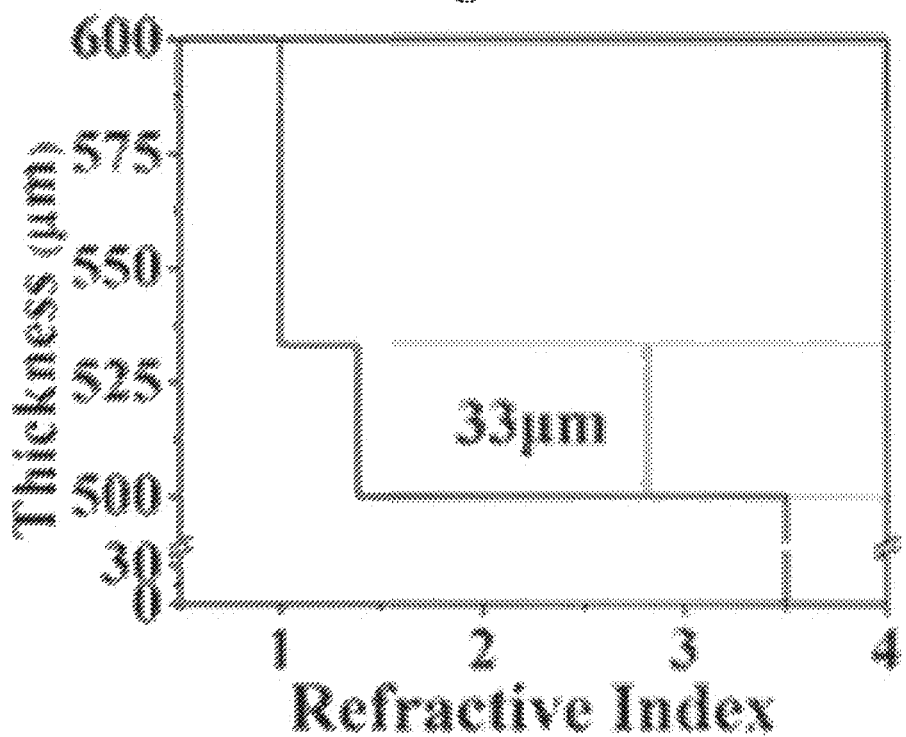
Figure 5D:
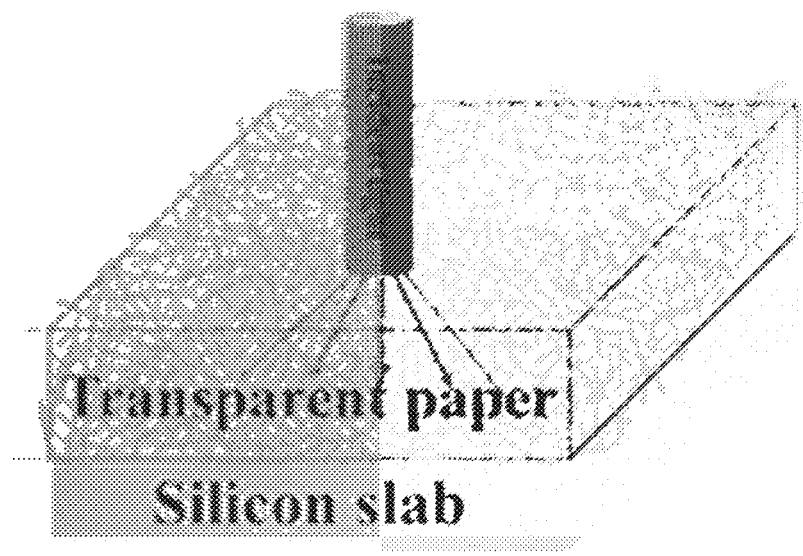

There are three possible mechanisms to achieve increased light absorption in the active layer: (1) the index of transparent paper is between the values for the Si substrate and air, which can effectively decrease the index contrast and lower the reflection for light entering from air to Si (compare FIGS. 5b and 5c); (2) a large light forward scattering effect of transparent paper, which can increase the path length of light in the Si layer (as shown in FIG. 5d); (3) a ultra-high optical transparency, up to 96%, of our transparent paper. These effects make transparent paper fundamentally better than plastic substrates for thin film solar cells.

Figure 5E:
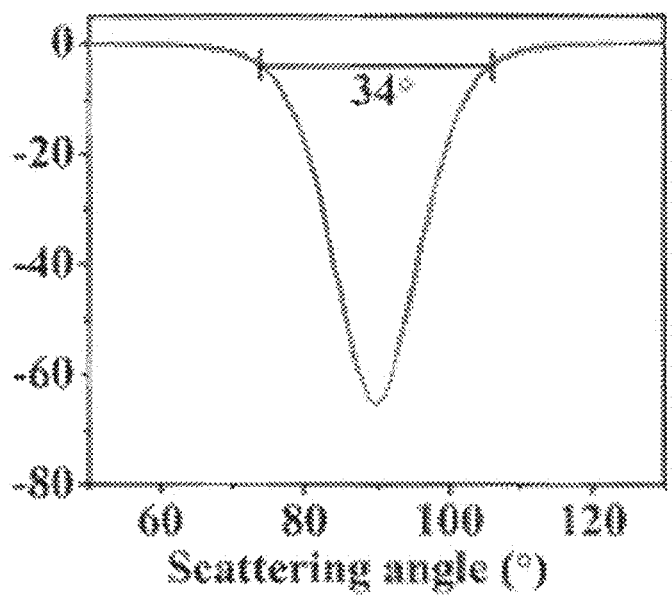

As shown in the schematic FIG. 5d, the direct incident light is scattered as it propagates through the transparent paper, generating a high transmission haze. To quantitatively explain the light scattering effect of transparent paper, an optical setup consisting of a rotating light detector was applied to measure the angular distribution of transmitted light. Light passing through transparent paper exhibits high diffuse scattering with an expected inverse Gaussian-like pattern (FIG. 5e). The angle is defined whereas the incident light is perpendicular to the surface of transparent paper as 90° and the scattering angle range is defined as the transmitted light at angles with an intensity larger than 5% of the peak transmission intensity at 90°.

Figure 5F:
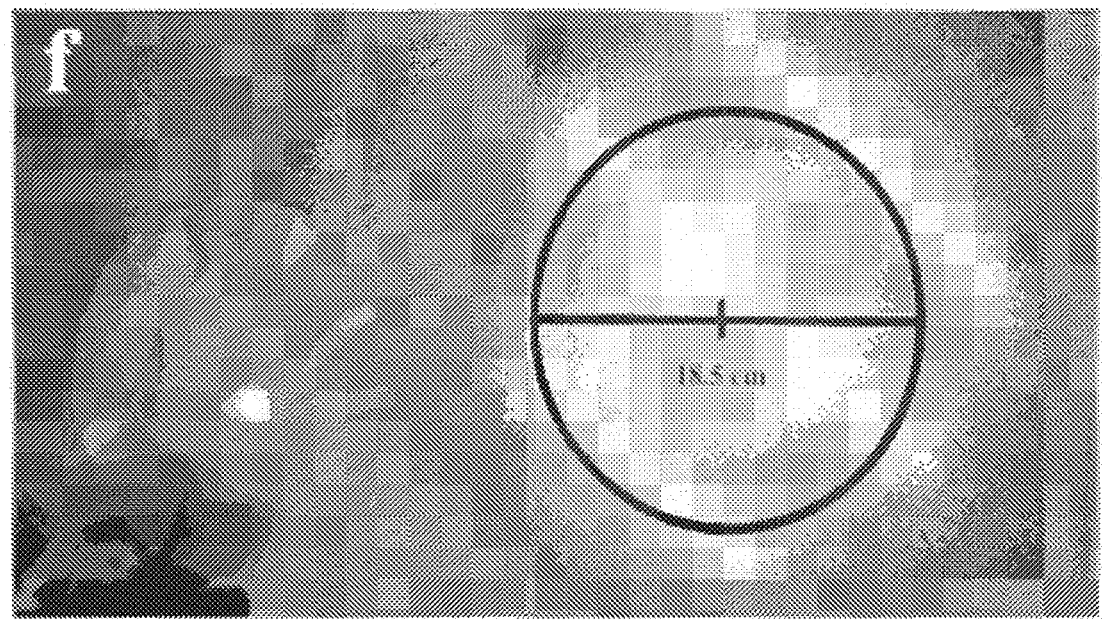
Figure 12A:
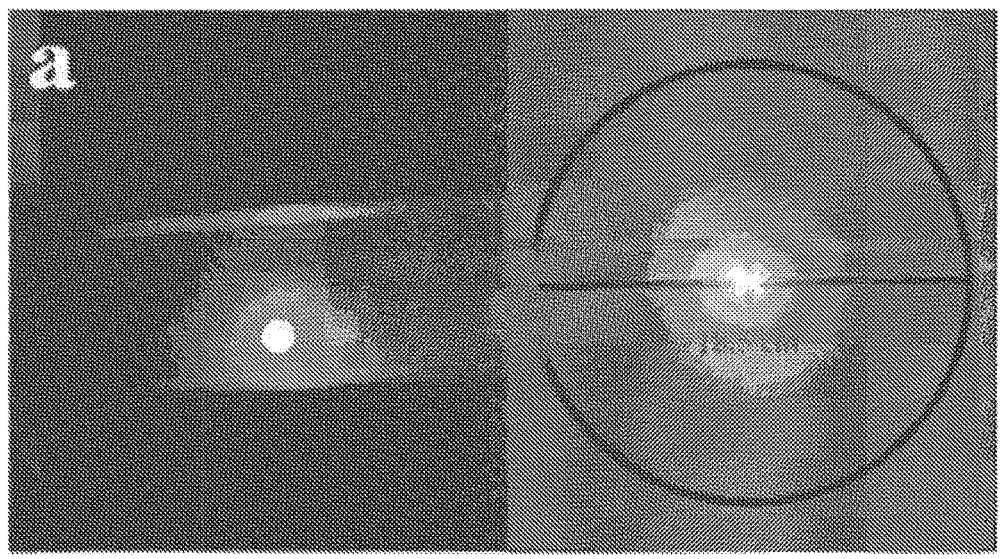
FIG. 12(a) shows the images to show the light scattering effect of PET when a green laser with a diameter of 0.4 cm strikes on them.
Figure 12B:
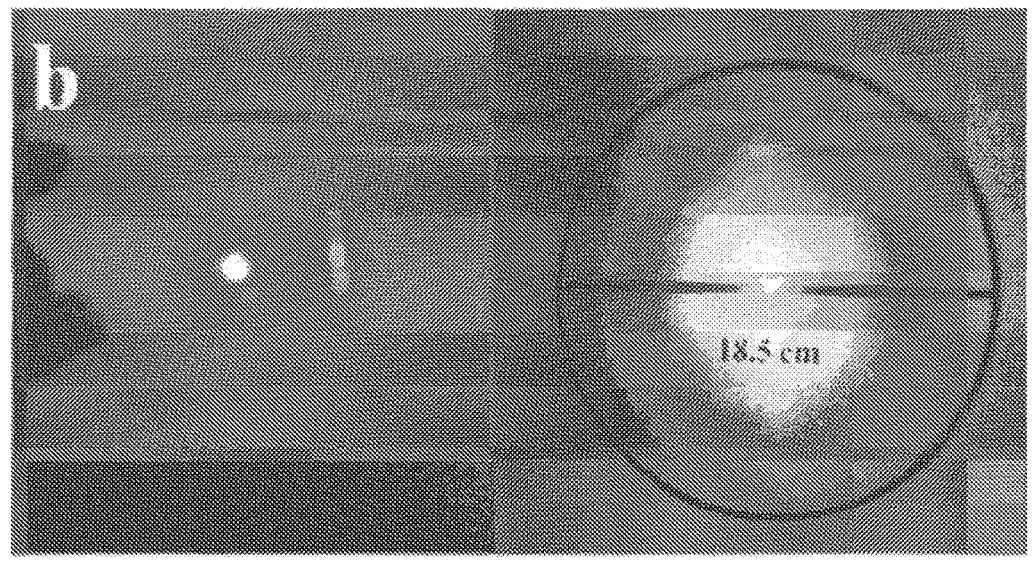
FIG. 12(b) shows the images to show the light scattering effect of glass when a green laser with a diameter of 0.4 cm strikes on them.
Figure 12C:
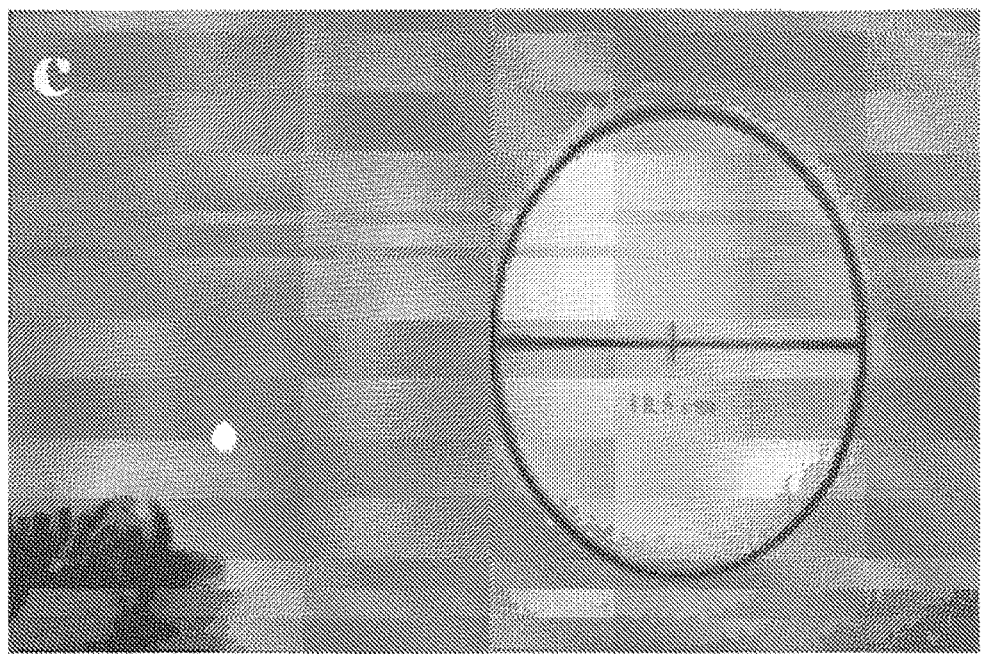
FIG. 12(c) shows the images to show the light scattering effect of the disclosed transparent paper when a green laser with a diameter of 0.4 cm strikes on them. The disclosed transparent paper obviously scatters light much more than PET and glass substrates.

Our transparent paper delivers a maximum scattering angle of 34°. Moreover, the distribution of light transmitted through the transparent paper demonstrated in this work is quite different from nanopaper (as shown in FIG. 11), since the transmitted light has a much narrower angular distribution. The light scattering effect is also visualized in FIG. 5f (the distance between the transparent paper and target is about 30 cm). A laser with a wavelength of 532 nm and a beam diameter of 0.4 cm passes through transparent paper and forms a larger illuminated circular area on the surface of the target with a diameter of over 18.5 cm. The same experiment was also applied to glass and PET to illustrate the light scattering effect, and the results are presented in FIG. 12. Since the transmission haze of PET and glass is lower than 1%, the transmitted light is scattered only slightly as visualized by a smaller illuminated area on the target behind the transparent paper.

FIG. 5g illustrates the light absorption of transparent paper laminated on a silicon slab. The data on the light absorption of TEMPO-oxidized wood fibers deposited on silicon is very similar and is shown in FIG. 13. Compared to a bare silicon slab, there is enhanced light trapping in all the prepared samples by approximately 10-18% from 400 to 1000 nm. These results show that: (1) both TEMPO-oxidized wood fibers and transparent paper can enhance the broadband absorption efficiency of the silicon slab; (2) transparent paper or TEMPO-treated wood fibers can be applied to a silicon slab with a simple coating, dipping, or lamination that depends on the specific application desired.

Figure 6A:
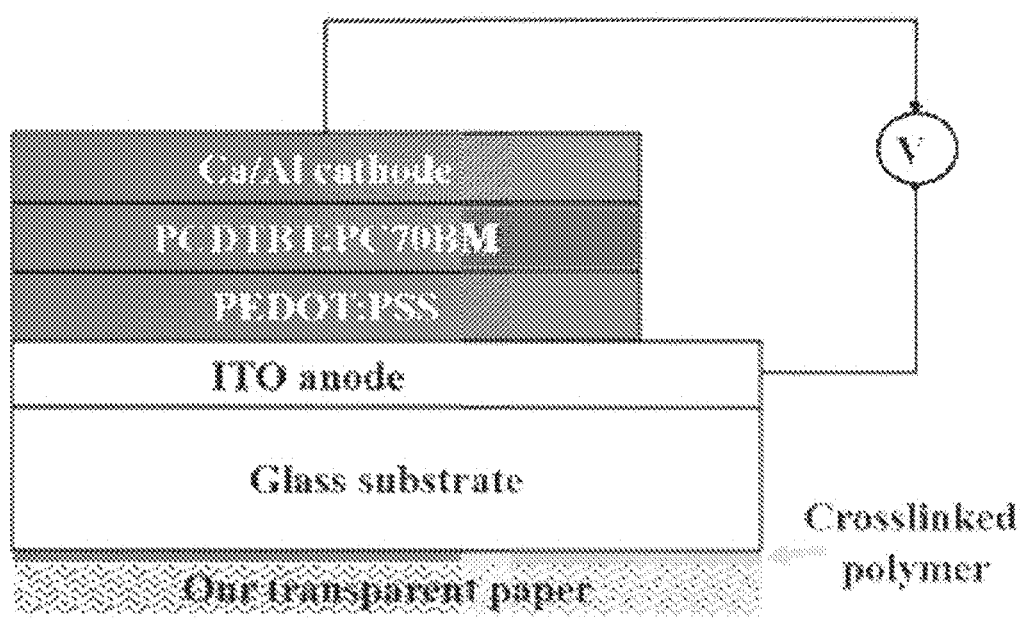
FIG. 6 (a) shows the structure of the OPV device with transparent paper attached on the opposite glass side.
FIG. 6(b) shows the dependence of the photocurrent of the OPV device with or without transparent paper on the light incident angle (defined as the angle between the incident light and the normal direction of the substrate), W and W/O represent OPV device with and without transparent paper, respectively FIG. 6(c) Angular distribution of the light caused by the haze effect of the transparent paper, where the light was incident at different angle; (d) Comparison of the I-V curves of the OPV device illuminated by diffused light (13 mW/cm$^2$).
FIG. 6(d) compares the PCE of the device illuminated by diffused light with an intensity of 13 mW/cm2 which further demonstrates the improved ambient light harvesting by the transparent paper.

FIG. 6a illustrates that the light harvesting of the OPV device can also be improved by simply attaching the transparent paper to the glass side of the OPV sample. On the opposite side, OPV device with a structure of indium tin oxide (no)/poly (3,4-ethylenedioxythiophene)-polystyrene-sulfonic acid (PEDOT-PSS)/Poly [N-9''-hepta-decanyl-2,7-carbazole-alt-5,5-(4',7'-di-2-thienyl-2',1',3'-benzothiadiazole)] and [6,6]-phenyl-C 71 butyric acid methyl ester (PCDTBT:PC70BM, 90 nm)/calcium (Ca)/aluminum (Al) has been previously fabricated, and the molecular structures of the photoactive materials for the OPV device is indicated in FIG. 14.

Figure 6B:
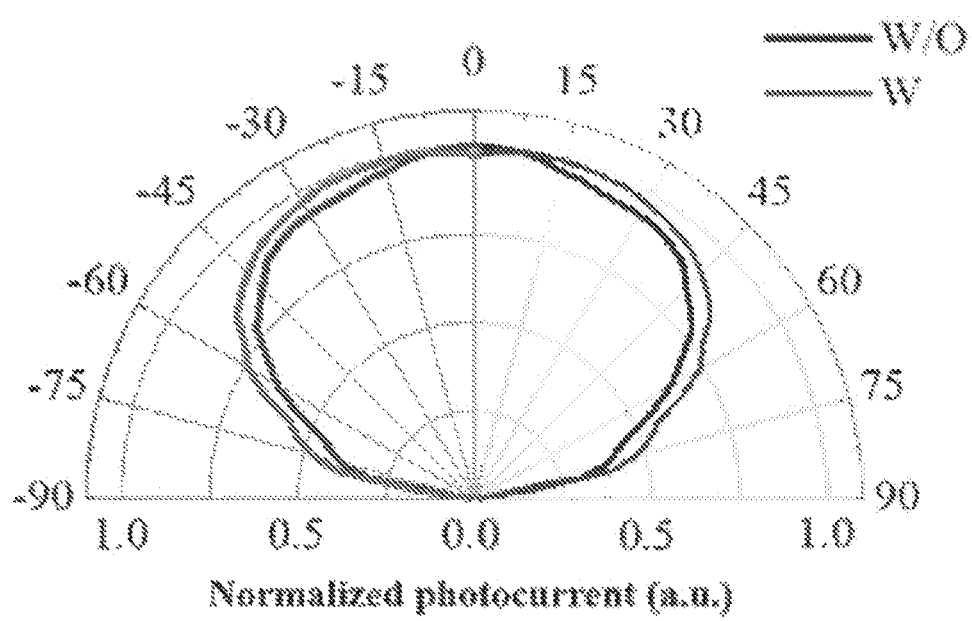

It is expected that the haze effect of the transparent paper causes incident angle dependent the photocurrent response. To verify this, the photocurrents of the devices under illumination from different incident angle were measured by illuminating the devices with parallel white light and rotating the devices gradually. The measured incident angle dependent photocurrents are shown in FIG. 6b. Here the incident angle is defined as the angle between the incident light and the normal direction of the substrate.

Figure 6C:
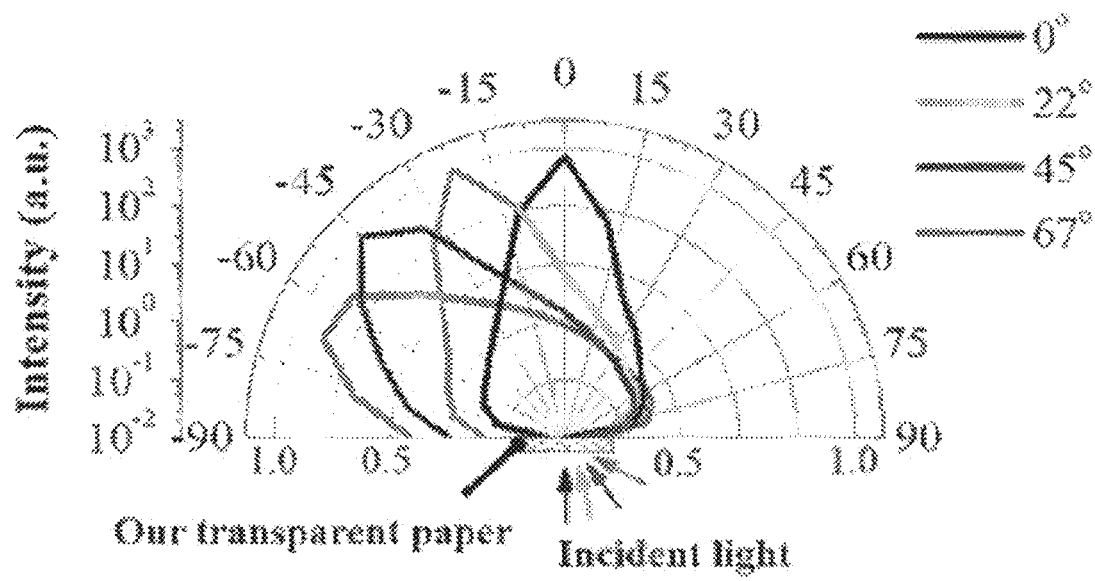

The photocurrent has been normalized to the values obtained from the control device (without transparent paper) with light incident to the normal direction. The photocurrent of the device with transparent paper was about 3% less than that of the control device at the normal incident direction, most likely due to the roughly 90% diffusive transmittance of the transparent paper. Interestingly, the photocurrents of the device with transparent paper exceed that of the control device at a larger incident angle above 7°. A large photocurrent improvement of over 15% were observed in an incident angle range of 60°~87°. The improved photocurrent should be correlated with the reduced reflection of the light at glass surface and a broadened angular distribution of the redirected incident light caused by the transparent paper, as shown in FIG. 6c. Similar antireflection effects have been observed in solar cells with microstructure arrays or a textured surface. The increased light harvesting at oblique incidence indicates that the device with transparent paper can collect the ambient light more efficiently.

Figure 6D:
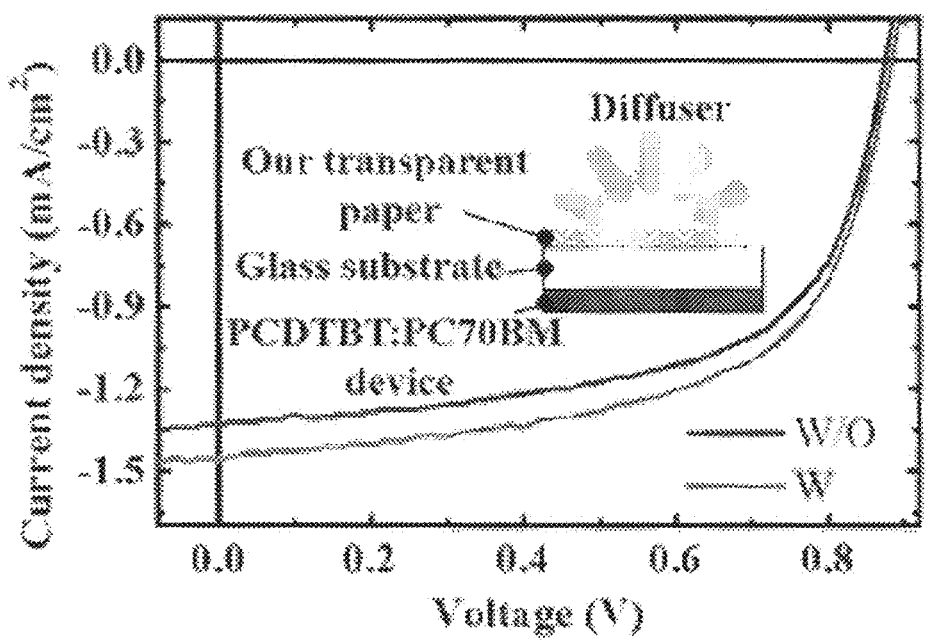

FIG. 6d compares the PCE of the device illuminated by diffused light with an intensity of 13 mW/cm2 which further demonstrates the improved ambient light harvesting by the transparent paper. The PCE of the PCDTBT: PCBM device with transparent paper was increased from 5.34% to 5.88% due to the increased the photocurrent by 10% (FIG. 6c). The performance improvement is attributed to better light harvesting from the diffused light since the I-V curves were obtained from the same OPV device upon attaching or after peeling off the transparent paper.

FIG. 6d further indicates the molecular structure of photoactive materials used in this OPV device. The increased ambient light harvesting by the transparent paper is particularly desirable for many photovoltaic applications, such as in application that cannot use mechanical light tracking systems to compensate for shift in the incident sunlight throughout the day like solar roofs, solar windows, and solar panels working in cloudy days where the sunlight is strongly scattered by the atmosphere.

EXPERIMENTAL

Bleached sulfate softwood pulp extracted from the southern yellow pine without beating or refining was treated with TEMPO-oxidized system. 5 g of wood fibers were dispersed into 1% pulp with deionized water, TEMPO and sodium bromide (NaBr) were then separately added into the wood pulp with doses of 10 wt % and 1.6 wt % based on oven-dry wood fibers, and the mixtures were finally stirred continuously for 10 min at 700 rpm to form a uniform suspension. 35 mL of sodium hypochlorite (NaClO) with a concentration of 12.5 wt % was titrated into the abovementioned suspension. The reaction time was monitored and the pH of the reaction system was kept constant at 10.5. The reaction lasted approximately 3-4 hours; however, the mixture was continuously stirred at 700 rpm for an additional 4 hours to ensure adequate reaction of the wood fibers. The dimension and morphology of the wood pulp before and after oxidization was tested using a Kajaani FS300 fiber analyzer and an optical spectroscope (OLYMPUS BX51). NFC (nanofibrillated cellulose) with a diameter of approximately 5-30 nm was extracted from the abovementioned TEMPO-oxidized wood fiber solution by homogenization with a microfluidizer.

The treated pulp was diluted to approximately 0.2 wt % in solution with deionized water. This diluted pulp was then used to fabricate transparent paper by a filtration method using a 20 cm filter membrane (0.65 μm DVPP, Millipore, U.S.A). The resulting wet film was placed between two stacks of regular paper and dried at room temperature. The optical properties of the paper were measured using a UV-Vis Spectrometer Lambda 35 containing an integrating sphere (PerkInElmer, USA).

600 μL wood fiber dispersion with a consistency of 1 wt % was coated onto a 1 cm2 silicon slab and dried at room temperature. To measure the optical properties of this sample, we built a custom optical setup. A xenon light source was used with a monochromator to select specific wavelengths from 400 nm to 1000 nm with a 10 nm step size. By comparing the amount of light entering the integrating sphere to the amount of light exiting the integrating sphere, the total absorption was measured. Two separate measurements are made: one baseline measurement with no sample in place to calibrate the system and a second measurement with the sample. By considering the difference between these two measurements, the absorptivity of the sample was calculated.

For the device fabrication, a 30 nm thick PEDOT: PSS layer was fabricated on a cleaned ITO/glass substrate by spin-coating with a rotating speed of 3,500 rpm. The spun PEDOT: PSS film was then baked at 130° C. for 15 min. PCDTBT: PC70BM dissolved in 1,2-dichlorobenzene with a blending ratio of 1:2 (by weight) was used for the spin-coating of photoactive layer. The active layer obtained by spin-coating with a rotating speed of 2400 rpm for 20 s has a thickness of approximately 90 nm. Then the Ca/Al bilayer cathode was thermally deposited in succession. When attaching the transparent paper on the glass surface, for a better light coupling from the transparent paper to the glass, as well as strong adhesion, a cross-linked polymer (ethoxylated bisphenol A dimethacrylate mixed with 1 wt % 2,2-dimethoxy-2-phenylacetophenone56) was formed between the transparent paper and the glass substrate.

Distribution of Wood Fibers Before and after TEMPO Treatment

Figure 7A:
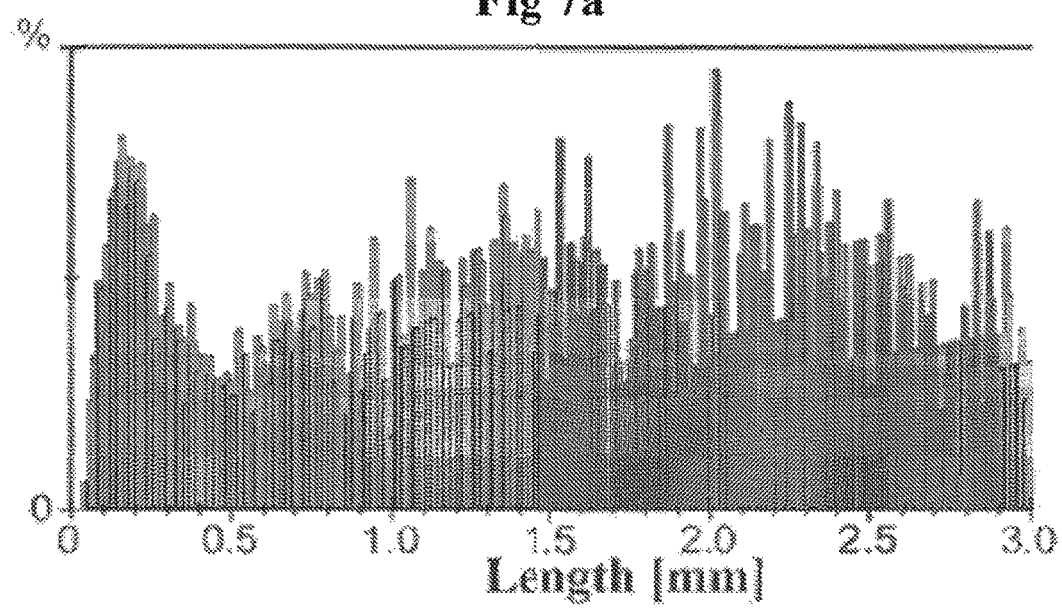
FIG. 7(a) shows the length distribution of original wood fibers
Figure 7B:
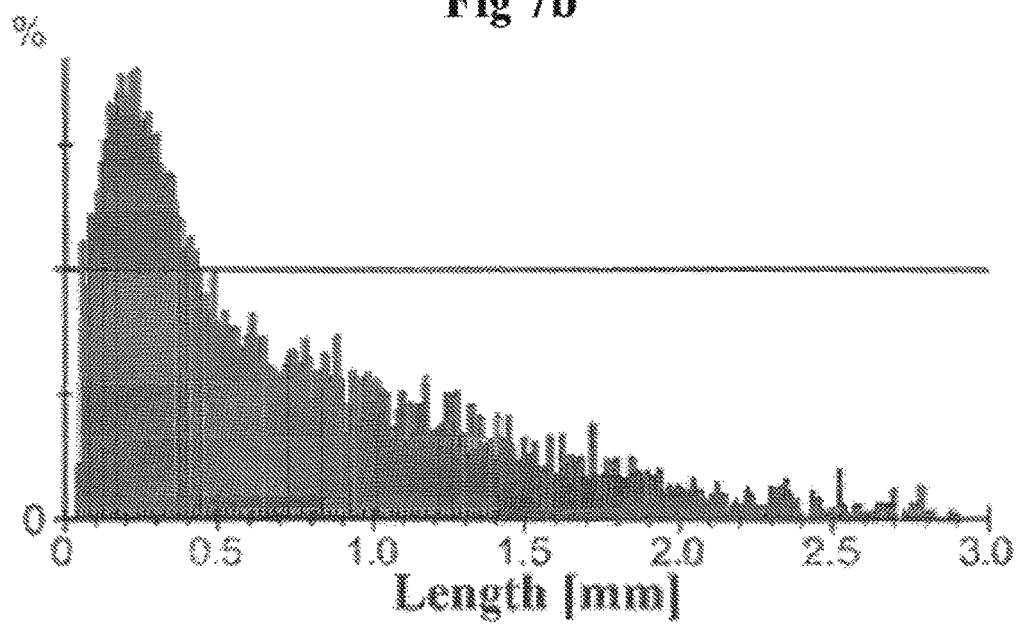
FIG. 7(b) shows the length distribution of TEMPO-oxidized wood fibers.

Fiber analyzer FS300 was used to investigate the distribution of fiber length and width before and after TEMPO treatment. The length distribution of original wood fibers is uniform (FIG. 7a), yet the length distribution of TEMPO-treated wood fibers tends to concentrate in the range of 0~1.0 mm, which indicates wood fibers are cracked into short fibers during the treatment (FIG. 7b).

Figure 7C:
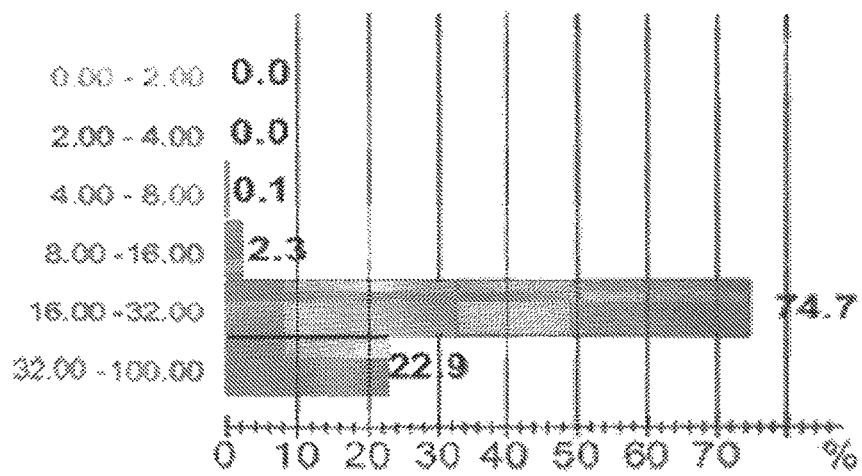
FIG. 7(c) shows the width distribution of original wood fibers.
Figure 7D:
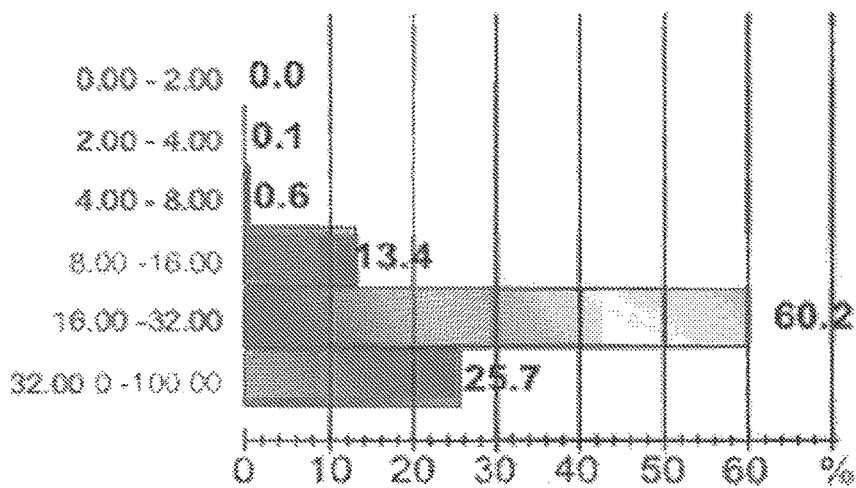
FIG. 7(d) shows the width distribution of TEMPO-oxidized wood fibers. The y-axis unit for (c) and (d) is μm.

FIG. 7c illustrates the width distribution of original wood fibers, after TEMPO system treatment, the percentage of wood fibers in the width range of 16.0~32.0 μm decreased from 74.7% to 22.9%, yet the amount of wood fibers in the width range of 8.0~16.0 μm is 6-fold more than that of original wood fibers (FIGS. 7c and d).

Wood Fibers after TEMPO Treatment

Figure 8A:
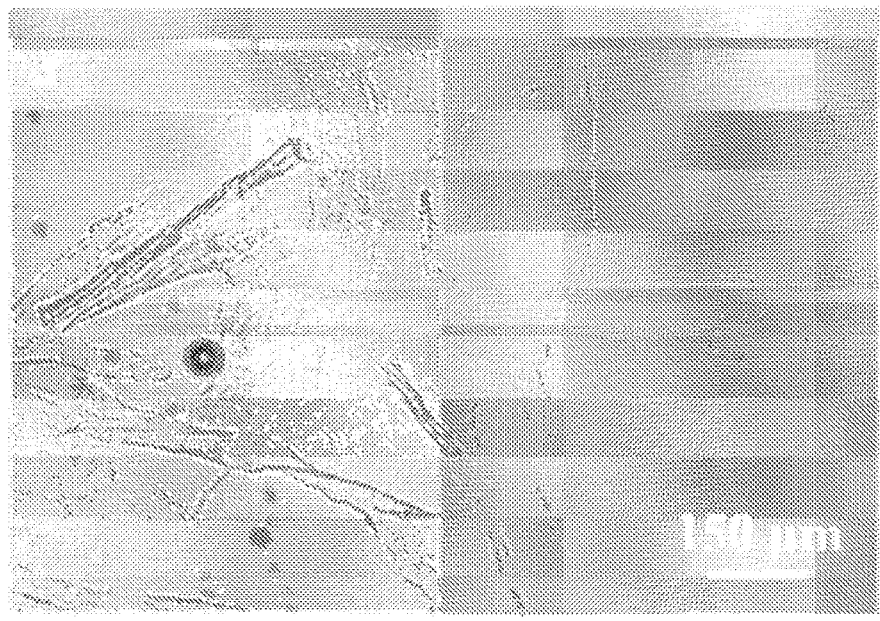
FIG. 8(a) shows optical microscopic picture of TEMPO-oxidized wood fiber. SEM images of crushed wood fiber
Figure 8B:
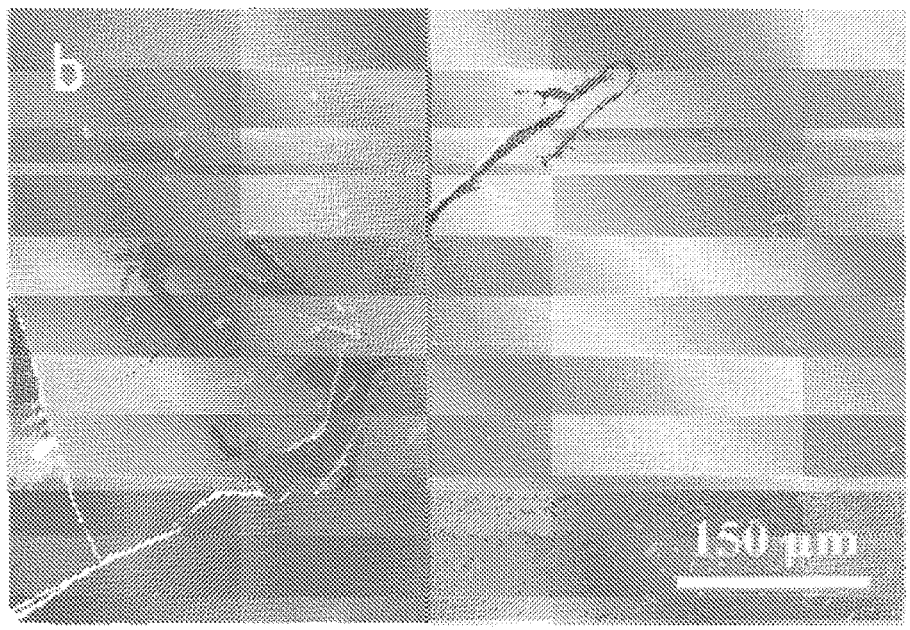
FIG. 8(b) shows SEM images of crushed wood fiber.
Figure 8C:
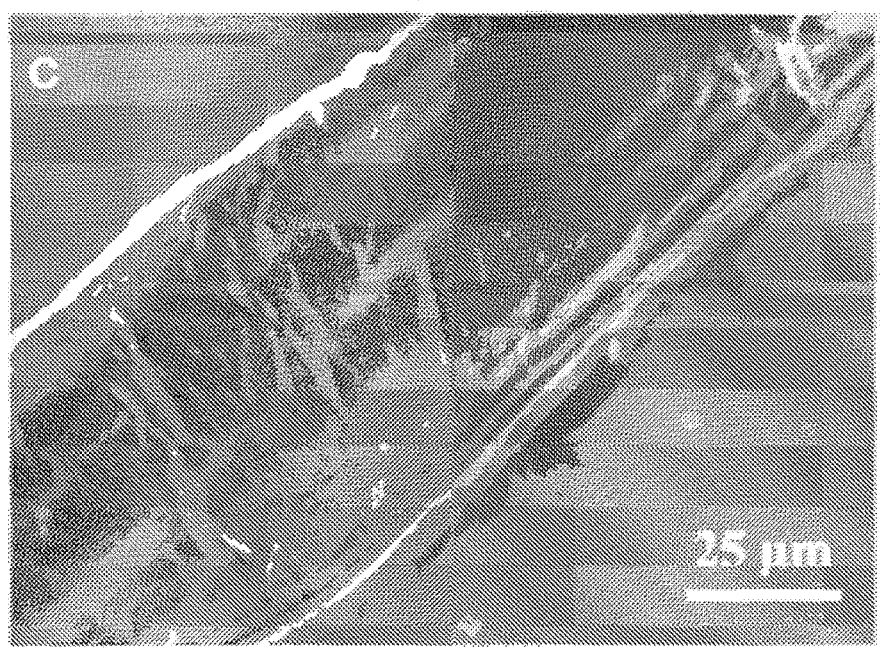
FIG. 8(c) shows SEM images of unzipped wood fiber
Figure 8D:
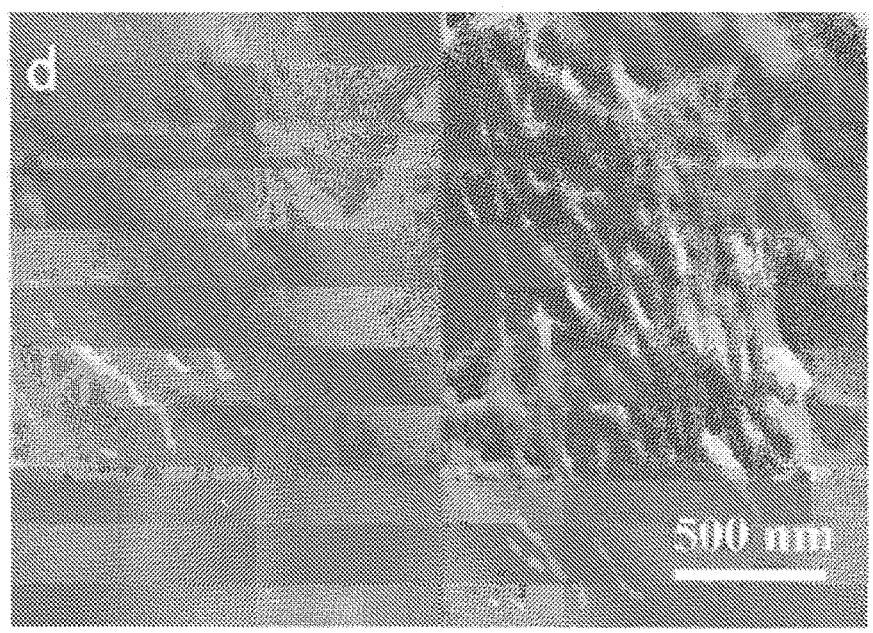
FIG. 8(d) shows nanofibers on the primary layer of cell wall after TEMPO treatment.

The morphological changes of wood fibers were clearly observed in FIG. 8a. After TEMPO treatment, the length of wood fibers becomes short and the cell walls of the fibers were cracked into small fragments. FIG. 8b and 8c show the wood fiber unzipped and cleaved in the axial direction that can improve the density of paper. Table S1 shows the grammage and thickness of various paper substrates for measurement of transmittance and transmission haze.

Transmittance and Haze of Paper with Different Thickness

Thickness of paper affects the transmission haze and transmittance of our transparent paper. As the thickness increases, the transmittance decreases due to an increase in to light scattering within the paper occurred (FIG. 3c). Meanwhile an increase in transmission haze was observed in FIG. 3d. Table S2 demonstrates the basic weight and thickness of transparent paper.

Mechanical Modelling

To reveal the origin of the enhanced mechanical properties, we conducted molecular dynamics simulations on scaled-down models for both TEMPO-oxidized fiber and original wood fiber with roughly comparable size. Our full atomistic simulation study employs the ReaxFF potential and simulation is carried out using Large-scale Atomic/Molecular Massively Parallel Simulator (LAMMPS). ReaxFF force field was developed via first principle and is also able to account for various non-bonded interactions such as van der Waals and coulombic types, and particularly important and convenient for the present study, it has an explicit expression for hydrogen bonds.

Figure 10A:
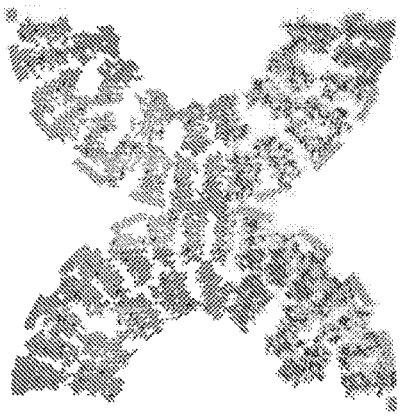
FIG. 10(a) shows the side view MD simulation model of inter-sliding of two original cellulose fibers.
Figure 10B:
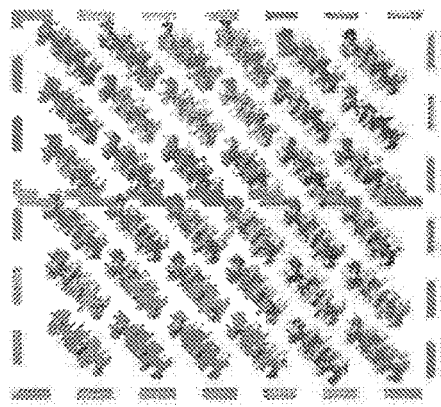
FIG. 10(b) shows the side view MD simulation model of two TEMPO-oxidized cellulose flakes.

FIG. 4d and FIG. 10a describes the atomistic model used to study the interaction between two original cellulose fibers. Each fiber takes a tubular structure and has the same axial length (7.8 nm) as the TEMPO-oxidized flakes in FIG. 4e and FIG. 10b but with a tube diameter of around 6 nm. FIG. 4e and FIG. 10b shows the atomistic model used to study the interaction between two TEMPO-oxidized cellulose flakes. Each flake has three layers and each layer consists of 6 TEMPO-oxidized cellulose chains. The initial stacking of those chains follows the crystalline parameters. The global size for each TEMPO-oxidized fiber is around 7.8 nm×3.9 nm×2 nm (7.8 nm is along axial direction). To reduce the computational expense, we model the two contacting halves of the neighboring hollow fibers and each half tubular fiber consists of 24 cellulose chains (with 16 chains on the outer surface). The simulations were subjected to a microcanonical (NVT) ensemble, carried out at a temperature of 5K, for the purpose of suppressing thermal noise to clearly reveal the fine feature of the hydrogen bonding stick-slip event. The time step is set to 0.5 femtoseconds (fs). The system is free to evolve for 50000 time steps until the right end of the top flake/fiber is assigned a constant axial velocity of 0.001 Å/fs, pulling the top flake/fiber to slide on the bottom flake/fiber, the left end of which is hold in position. The energy data points were sampled on every 200 time steps while the force data points were sampled on every 1000 time steps.

Trees are of significance for moderating the greenhouse effect by a photosynthesis that removes carbon dioxide from the atmosphere and store large amount of carbon in their tissue. Wood is a porous and fibrous structural tissue of trees (FIGS. 15(b) and (c)) and consists of microfibers with a hierarchical structure, as shown in FIG. 15(d). A large microfiber is composed of thousands of nanofibers. In this work, we fabricate paper with high total forward transmittance but dramatic different light scattering behavior via two different strategies. The key design principle is that rich nanostructures with tailored mesopores allow us to control the scattering of photons through such random media. The collective behavior at the microscale leads to macroscopic optical properties.

In order to achieve different microstructures, we design and fabricate paper substrates using cellulose fibers with two different size dimensions. The resulting paper shows dramatically different optical scattering behavior. In one case, the resulted paper is very hazy with significant amounts of mesopores and a relatively rougher surface than the clear paper (FIGS. 15(e) and (f)). The hazy paper is directly fabricated via nanowelding microfibers in ionic liquid. These welded microfibers lead to much denser packing than regular paper, which dismiss the large air cavities (~50 μm) and leads to the high optical transmittance. Meanwhile, a significant amount of mesopores still exist, which causes significant light scattering through the ~40-50 μm thick paper. In another case, the paper substrate is super clear with a small quantities of mesopores and a uniform surface texture (FIGS. 15(g) and (h)). The building block of the clear paper is a purified nanofiber disintegrated from wood fiber that exhibit a uniform size with diameter around 10-20 nm and a length around 500 nm. These nanofibers with excellent flexibility lead to a dense microstructure and optical appearance is as clear as high-quality $SiO_2$ glass. For the first time, we significantly manipulate the light scattering in highly transparent paper by tailoring the fiber dimensions and packing density; the collective result is that the optical haze is adjustable between smaller than 1% to larger than 90% with transmittance larger than 90%.

Following the design in FIG. 15(g), we achieved optically clear paper with the lowest haze that has not been reported in literature. The detailed procedure for its fabrication is discussed in the Experimental Section and Supporting Information (FIG. 7a-d). To summarize, the CNF (FIG. 16(a)) was obtained by a homogenization of 2,2,6,6-tetramethyl-piperidine-1-oxyl (TEMPO)-oxidized wood fibers and then a centrifugation to remove any residual microfibers. The TEMPO treatment was used to swell the cell wall of the wood fibers. A uniform CNF with a diameter of ~20 nm was obtained after further homogenization and centrifugation treatment. The clear paper in size A4 as shown in FIG. 16(b) was prepared through a scalable casting method with this uniform CNF suspension.

We further investigate the total transmittance and the transmittance haze of optically clear paper using a UV-vis spectrometer with an integrating sphere. The total transmittance is ~90% from wavelengths 400 nm to 1100 nm, which is similar to thin flexible glass (Corning Inc., US) and polyethylene terephthalate (PET). The optical haze of clear paper is 0.5% at 550 nm, which is similar to a glass substrate. This value meets the standards for high-end displays, which require an optical haze value less than 1%.(25-27) Our clear paper made of purified CNF shows a much smaller haze value than previous reported nanopaper.[23] Approximately 5% by weight of microfibers were removed during centrifugation at CNF purification step. Surprisingly, the transmittance haze decreases dramatically from 10% in nanopaper with non-centrifuged CNF to 0.5% in clear paper when such low amount of microfibers were removed (FIG. 9). The mechanisms of optically clear paper with CNF fibers that may explain this behavior include: 1) the nano sized CNF building blocks scatter light much less than larger fibers (i.e. microfibers);[23,28] 2) the uniform CNFs and strong fiber-fiber interactions during the drying process leads to excellent packing toward a dense structure (density 1.2 g/cm$^3$), which decreases the light scattering through the bulk paper, 3) clear paper shows a super smooth surface (root mean square roughness ~2.6 nm, as discussed below) that induces negligible light scattering at the surface. The angular distribution of transmitted light was measured with a rotating light detector (FIG. 10) and the normal direction of transmitted light was defined as 90°. 100% light is concentrated at 90°±1°, with the presence of 0.5% transmittance haze (FIG. 11). The transmitted light is concentrated on the incident direction with no scattering.

Clear paper made of one-dimensional CNFs exhibit excellent mechanical strength and a smooth surface roughness. Compared to plastic that is made of homogeneous polymer, the clear paper is composed with one-dimensional nanofibers that possess rich hydroxyl groups. Coupled with the outstanding mechanical properties of individual CNFs (Young's Modulus 150 GPa of cellulose nanocrystal),(29, 30) the network structure linked by strong hydrogen bonds between CNFs leads to both excellent mechanical strength and flexibility in clear paper (FIG. 12(a-b)). Surprisingly, the mesoporous clear paper with a network structure has a small surface roughness, as shown in FIG. 16(e). The atomic force microscope (AFM) topographical line scan reveals root mean square (RMS) roughness of 2.6 nm.

We invented a simple and fast in-situ pressing method with partially dissolved microfibers to fabricate super hazy paper. The detailed procedure is presented in the Experimental Methods section. To summarize, a piece of paper made with regular microfiber was immersed in ionic liquid 1-Butyl-3-methylimidazolium chloride (BMIMC1) for 15 minutes. The paper saturated with ionic liquid was then in-situ hot-pressed. The ionic liquid breaks down the hydro bonds between the cellulose chains and effectively dissolve the surface layer of the fibers while remaining the microfiber backbones.(31-33) Additional washing in methanol was used to remove ionic liquid inside the hazy paper. The paper changes from opaque to transparent after the ionic liquid treatment (FIG. 17(a)). The in-situ dissolution of microfibers under hot-pressing serves two purposes: 1) the dissolved surface lead to strong nanowelding between microfibers; 2) the microsized vacancies initially occupied by air in the paper are filled by dissolved cellulose under pressure. The dissolved cellulose nanofibers by ionic liquid during in-situ pressing are clearly observable in the finished paper (FIG. 3(b)). The in-situ pressing greatly increases the packing density and removes the micro sized cavities filled with air in the paper, which leads to the high transmittance. Note that the density of initial paper is 0.5 g/cm$^3$, while the density of hazy paper is ~1.1 g/cm$^3$.

We characterized the optical properties of transparent and hazy paper with an integrating sphere and a rotating light detector. The in-situ pressed paper shows a high optical transmittance of up to 90% at 550 nm, which is comparable to flexible glass and PET (FIG. 17(c)). Interestingly, the transparent paper also shows a super high haze value for forward transmitted light, with a value of 91% at 550 nm (FIG. 3(d)). Note that the transmittance haze for glass and PET is less than 2%.(34, 35).

Both the hazy paper and the clear paper are fabricated with essential the same material of cellulose. The unique combination of high transmittance and high haze results from the unique structure. The porous structure in the paper causes numerous light scattering, which randomly redirect light's propagation path and lead to the high haze in the transmission. The strength of the scattering sensitively depends on the size of the pores. Clear paper has mesopores on the scale of a few nanometers, much smaller than the optical wavelength, which has a minimal scattering angle. In contrast, hazy papers have additional pores hundreds of nanometers in size, leading to much larger light scattering angles. We have demonstrated that a dramatically different light scattering, behavior is achieved in highly transparent paper. Since the essential material for both paper substrates is the same, cellulose, the dramatic difference in the optical properties results from their structures. To correlate the optical properties with the structure of two different types of paper, we investigate the pore distributions of the substrates with various different techniques resolute to different length scales. A Brunauer-Emmett-Teller (BET) was used to characterize pores with a diameter less than 100 nm (FIG. 18(a)). Both types of paper possess many mesopores with a peak at the same pore size of 4 nm. Although the pores are similar in both paper substrates, hazy paper has about twice the pore volume than the clear paper. We used a magnified AFM with a scan area of 1 μm*1 μm to further obtain the pore size and size distribution for two kinds of paper (FIG. 18(c-d)). Clear paper shows a much denser surface containing mesopores in the range of 10-20 nm, which agrees with the BET measurement. Similar AFM images at different spots were taken, which did not show pores with a size larger than the 100 nm exhibited in clear paper. However, hazy paper possesses pores with a size close to 0.5 μm.

Figure 18:
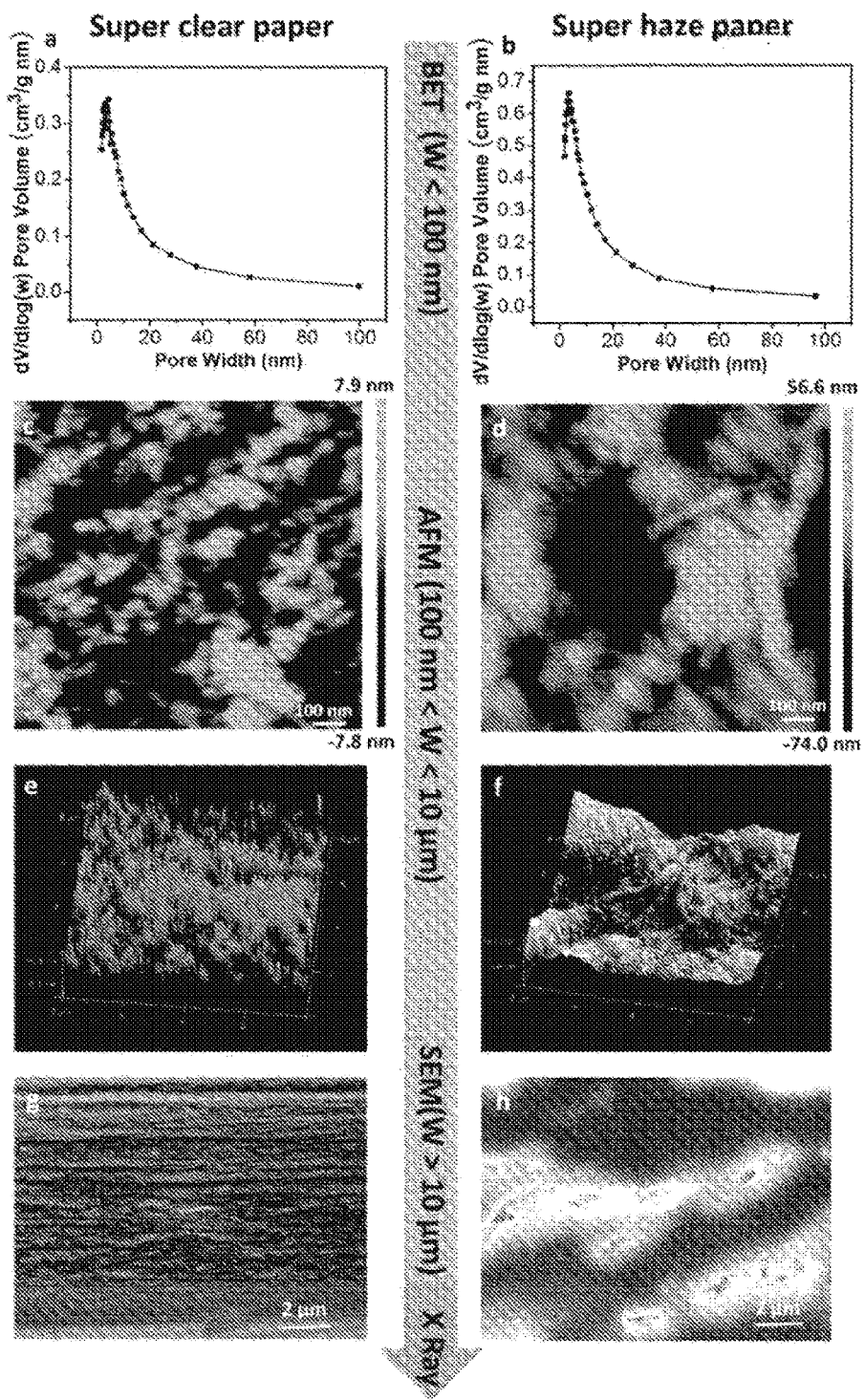
FIG. 18a-FIG. 18h shows characterizations of mesoporous structures in clear and hazy paper at different length scales. BET-BJH pore distributions, AFM height images (scan area: 1 μm*1 μm), 3D AFM images (scan area: 8 μm*8 μm) and cross-section SEM image for clear paper are shown in (a), (c), (e) and (g) respectively. The same characterizations are shown for hazy paper in (b), (d), (f) and (h).

Since the AFM image with a 1 μm*1 μm scan area only reveals the local structure of paper, a 3D AFM with a much larger scan area (8 μm*8 μm) was used to investigate surface roughness and 3D morphology (FIG. 18(e-f)) of two papers with the same thickness (40-50 ftm). The hazy paper shows a much rougher morphology than the clear paper. The peak-valley height difference is 9.3 nm in the clear paper and 488 nm in the hazy paper. More AFM data that reveals the surface morphology is found in Supplementary Materials (FIGS. 13 and 14). Cross-section scan electronica microscope (SEM) by breaking the sample in liquid nitrogen reveals pores with a size of 1-2 μm for hazy paper. Statistics counting reveals there are 3% volume pores in this size range. No pores in this range were observed in SEM images of clear paper, FIG. 18(g-h). We used X-ray 3D topography to investigate pores larger than 10 μm in hazy paper (video can be found in the Supplementary Materials). The microfiber backbone and the layer-bylayer structure are well defined in the hazy paper (FIG. 30(a-b)). The BET-BJH data shows that the regular fibers also possess mesopores (FIG. 31(a)), but the pore between the neighboring fibers is mostly at ~50 ftm (FIG. 31(b)). Note that both the clear and the hazy paper show a much higher packing density than the regular paper (FIG. 18(g-h) and FIG. 31). The four different measurements, BET, AFM, SEM, and X-ray topography, at different length scales reveals dramatically structural difference between clear paper and hazy paper. Due to the fibrous structure, clear paper has a mesoporous structure that is not seen in traditional transparent substrate (i.e. glass or PET). Hazy paper contains additional pores with a larger size (~0.5-1 µm), but lacks pores seen in regular paper (~50 µm or larger). Pores with a size ~0.5-1 µm are close to the wavelength of visible light, which causes the prominent light scattering that cause a high haze value.

Figure 19A:
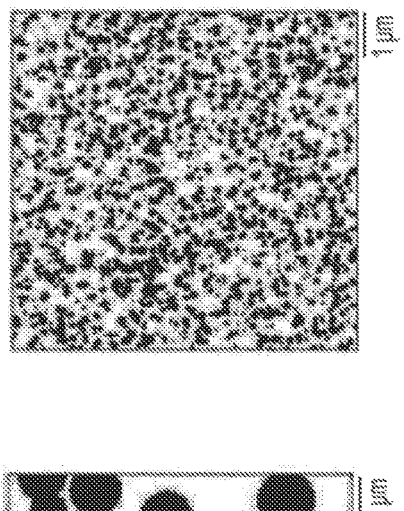
FIG. 19a-FIG. 19f shows optical simulations of light scattering of super haze paper and super clear paper. (a) Full-wavelength simulation of incident light through a network with randomly distributed diameters. Top view of the structures used for the modeling of the haze (b) and the clear (c) papers, respectively. The black represents a material with refractive index n=1.5 while the white represents empty space. The heights are 200 nm and 5 nm for (b) and (c), respectively. The structure of (b) is placed on a 200 nm thick uniform material (n=1.5). (d) and (e) show the distribution of scattered light when a normally incident light passes through the structure (b) and (c), respectively. Data is shown in percentage of incident light energy. (f) The spectra of scattered light for hazy paper (solid line) and clear paper (dashed line) in visible wavelength range.
Figure 19B:
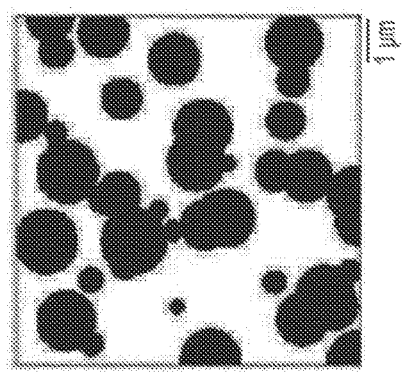
Figure 19C:
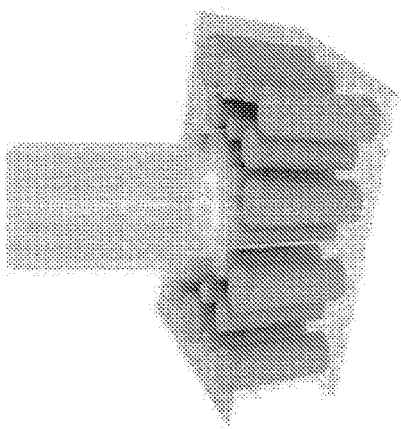
Figure 19D:
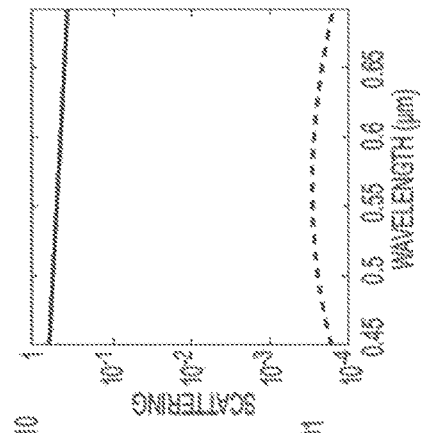
Figure 19E:
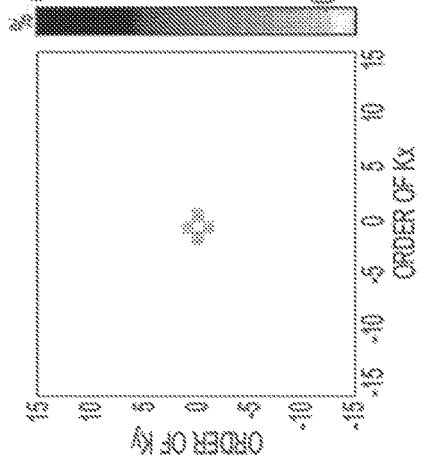

The transmittance haze is caused by the scattering of light through the paper, which is closely connected to its microscopic structure. To study this connection, we performed full-wave optical simulations to characterize the light scattering based on the meso-structure measured by 3D AFM. The AFM measurements in FIG. 18 show that the spatial variation across the surface is significantly greater in the hazy paper than in the clear paper. The RMS of the surface height of the hazy paper is 137 nm, on the same order of magnitude as the visible light wavelength. In contrast, the RMS for the clear paper is only 2.6 nm. For the model of the light scattering in paper, the simulated structure consists of a set of randomly distributed cylinders in air (FIG. 19(a)). The refractive index of the cylinders is 1.5 and the height is 200 nm for the hazy paper (FIG. 19(b)). We tune the distribution of the radius and positions of the cylinders so that the RMS of the surface height is the same as the hazy paper. Similarly, smaller cylinders are used to model the surface morphology of the clear paper as shown in FIG. 19(c). The height is 5 nm to keep the RMS the same as the clear paper. We use Stanford Stratified Structure Solver (S4) to solve the Maxwell-s equations in the frequency-domain. (36) Periodic boundary conditions are used with a period of 8 ftm in the lateral directions. Since the period is much larger than the wavelengths of visible light, we expect to see a large number of diffraction beams when light passes through the structure. The light intensity in these diffraction directions directly measures the strength of light catering. To visualize the scattering strength, we show the intensity in all forward-diffracted directions. These directions are labeled by their parallel wave vectors:

$$(k_x, k_y) = (m, n)\frac{2\pi}{a}$$

Where integer "m, n" are the order number; a=8 µm in the period The wave in the vertical direction is calculated as:

$$k_z = \sqrt{\left(\frac{2\pi}{\lambda}\right)^2 - k_x^2 - k_y^2}$$

Where λ is the wavelength (600 nm). The direction of the wave vector determines the propagation direction of the scattered light. As shown by FIG. 19(d-e), light passing through the surface with a large spatial variation (FIG. 19(b)) is redistributed to a wide range of different diffraction directions (FIG. 19(d)). In contrast, there is almost little light scattering (FIG. 5(e)) for the case of the surface with a small spatial variation (FIG. 19(c)). The direct forward transmission in the normal direction is intentionally neglected in order to better visualize the scattered light.

Figure 19F:
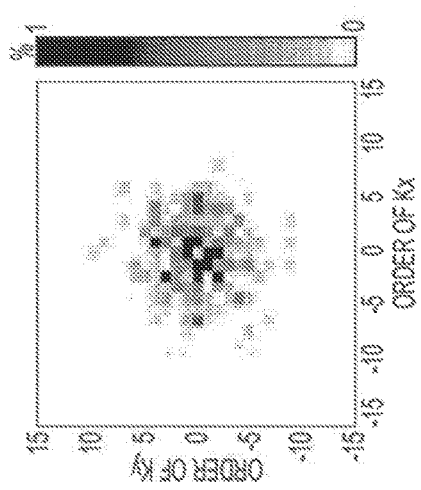

We further show the scattering of light over the entire visible wavelength range for these two different paper models. FIG. 19(f) shows the amount of the light scattered by the structures, i.e. transmission haze, in FIG. 19(b) and FIG. 19(c) assuming light is incident at the normal direction. It can be clearly seen that the surface with large spatial variation (FIG. 19(b)) scatters light strongly (solid line FIG. 19(f)), causing the paper to appear hazy. On the other hand, the surface with small spatial variation surface (FIG. 19(c)) has extremely weak light scattering and causes the high clarity of the paper.

Paper with a large forward transmittance and controllable scattering (being high clarity or high haze) can be used for a range of emerging photonics and optoelectronics devices. For example, super hazy transparent paper has a large angular distribution of light scattering that can be used in photonics such as solar cells and thin-film organic light-emitting diodes, where coupling of light into or out of the devices is crucial for high performance devices. Super clear paper has a similar clarity as high display-quality glass and plastics. As opposed to glass and plastic, clear paper is mesoporous with simultaneous nanometer scale smoothness. The 3D mesoporous structure in clear paper can enable new bulk engineering routes by loading nanometer sized molecules or flowing nanofluidic toward 3D photonic or 3D fluidic.

While the controllable structures in transparent paper are promising for a range of future technologies, the processing compatibility needs to be investigated to fully ensure practical applications. In order to prove that transparent paper is compatible with the processing for commercial devices, we demonstrated the first high-performance capacitive paper touchscreens using the processes and designs for the commercial plastic-based touchscreen. FIG. 20(a) illustrates the structure of a capacitive-based multi-points touchscreen. The patterned graphene layer is used as a group of electrodes and the mutual capacitance of those electrodes is monitored by a designed circuit. The human fingers function as the other electrode to form the local capacitor. Local capacitance upon touch can introduce an electrical signal to identify touch position. Compared to a resistive touchscreen, the capacitive touchscreen has the advantage of higher sensitivity, longer life, and response to the multi-points touch. As shown in the inserted image of FIG. 20(b), chemical vapor deposited (CVD) single layer graphene was dry-transferred onto a piece of clear paper as a replacement for conventional indium tin oxide (ITO) as a transparent electrode. The smooth surface of the clear paper leads to an excellent performance of the graphene-on-paper, with a sheet resistance of 445 Ohm/sq and transmittance of 89% in the visible range (FIG. 20(b)). The dry-transferred graphene on paper has a similar performance to that of plastic, which confirms its compatibility for processes (37).

Figure 20:
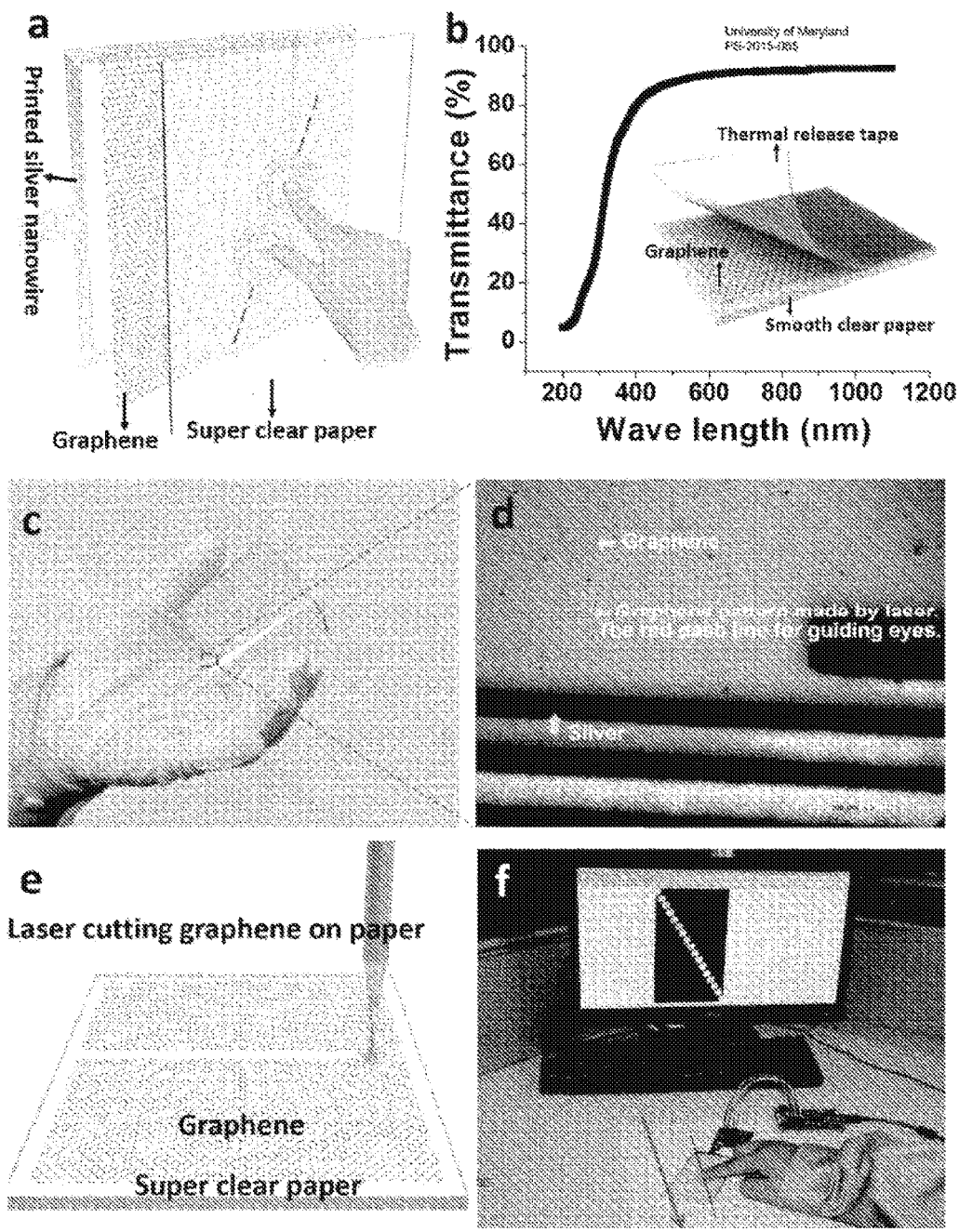
FIG. 20a-FIG. 20f shows super clear paper based multi-touch screen with a thin layer of graphene as a conducting electrode. (a) A schematic of paper based multi-touchscreen. (b) Optical transmittance of while device. The inserted schematic shows the dry transferring process for graphene on clear paper. (c) Picture of a highly flexible, invisible paper touch screen. (d) The zoomed-in image to show detailed graphene electrodes and metal contacts patterned by laser. The red dash lines is drawn for guiding eyes. (e) schematic showing the procedure of laser cutting graphene on paper (f) Measurement of linearity of paper touch screen.
Figure 22C:
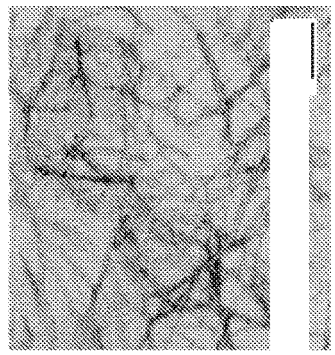
FIG. 22a-FIG. 22e shows (a) Picture of wood trunk; (b) TEMPO-oxidized wood fibers; (c) TEM image of purified CNF. (d) Picture of 0.2% nanocellulose suspension in the container. (e) Picture of a A4 size clear paper peeled off from the glass container.
Figure 22B:
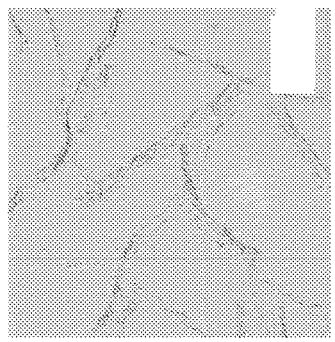
Figure 22D:
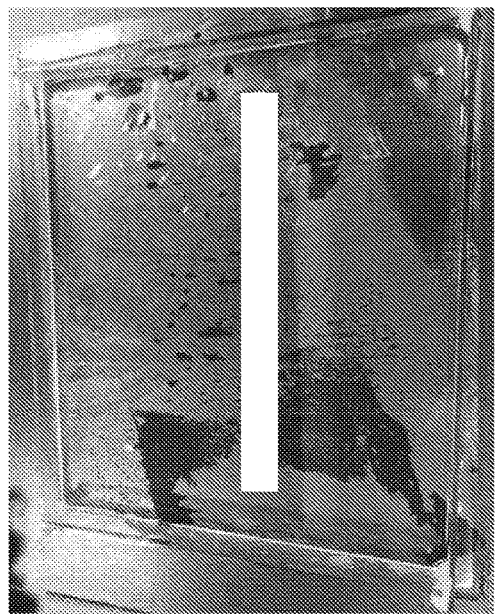
Figure 22A:
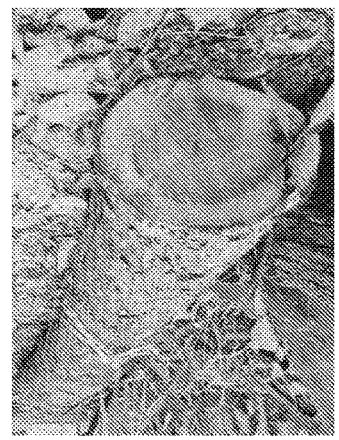
Figure 22E:
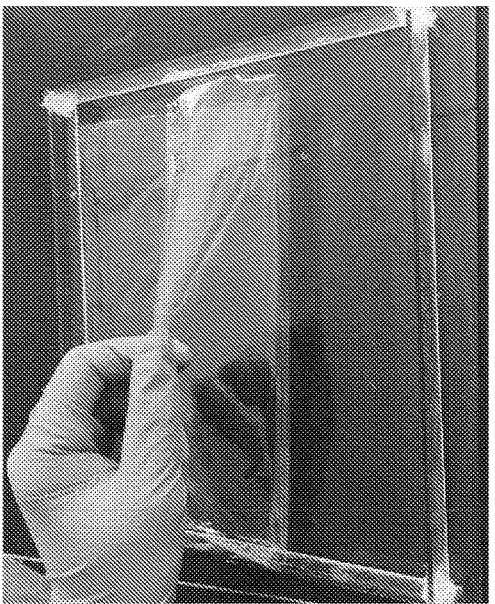
Figure 23B:
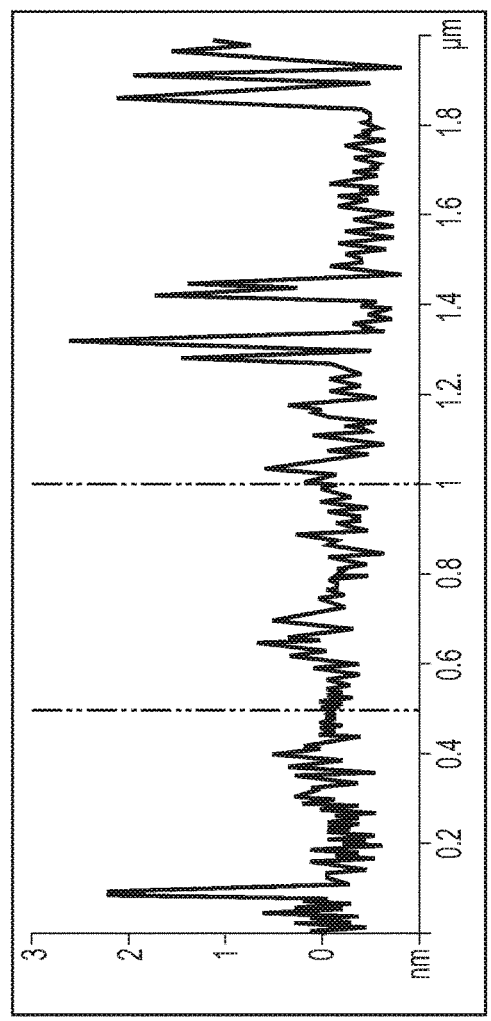
FIG. 23a-FIG. 23b shows (a) AFM height image of cellulose nanofiber. (b) The corresponding line scan profile in image (a).
Figure 23A:
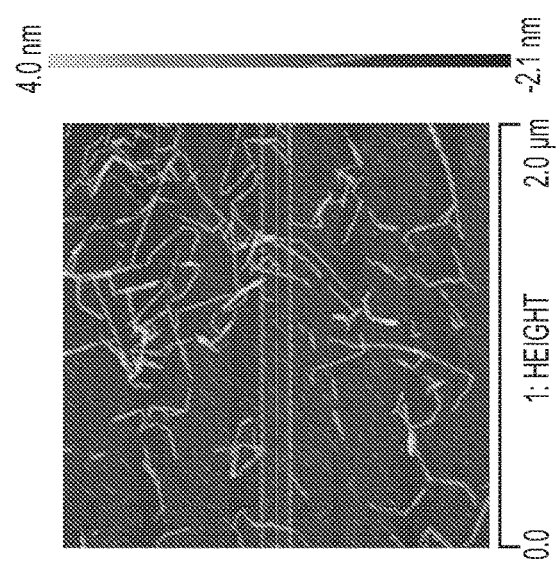
Figure 24:
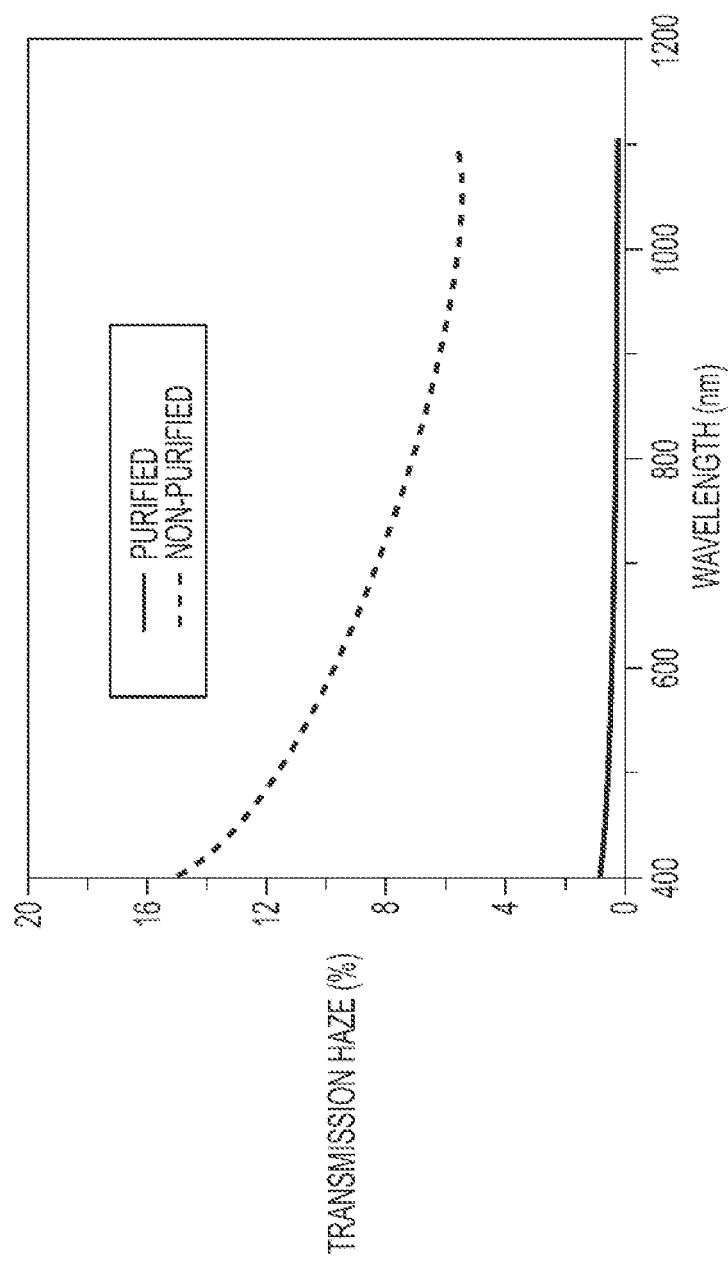
FIG. 24 shows Transmission haze of transparent paper made of non-purified CNF and purified CNF (paper thickness is ~40-50 μm)
Figure 27B:
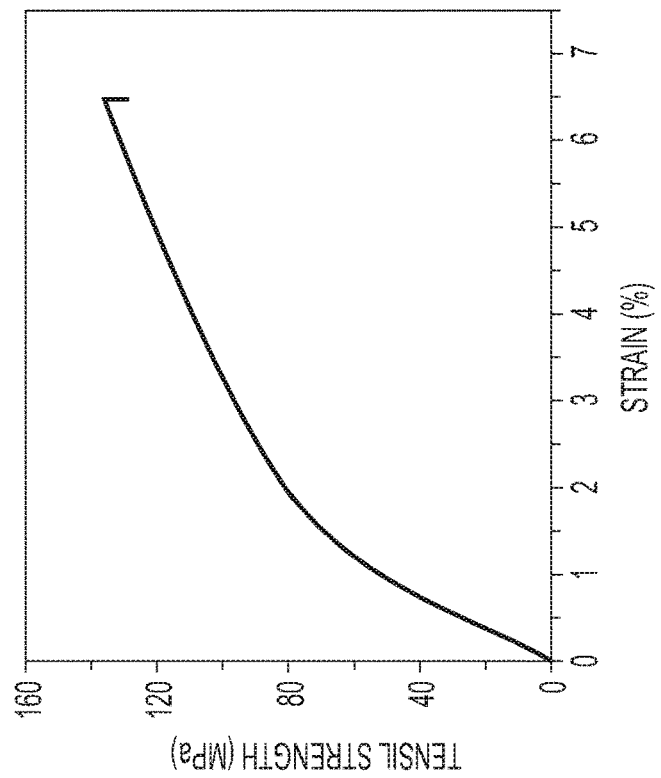
FIG. 27a-FIG. 27b shows (a) Stress-strain curve of clear paper made of purified CNF. (b) A picture of bent clear paper with a bending radius of 2 mm. Inset shows that no cracking was observed on the clear paper after bending test. The thickness of super clear paper is 45_m.
Figure 27A:
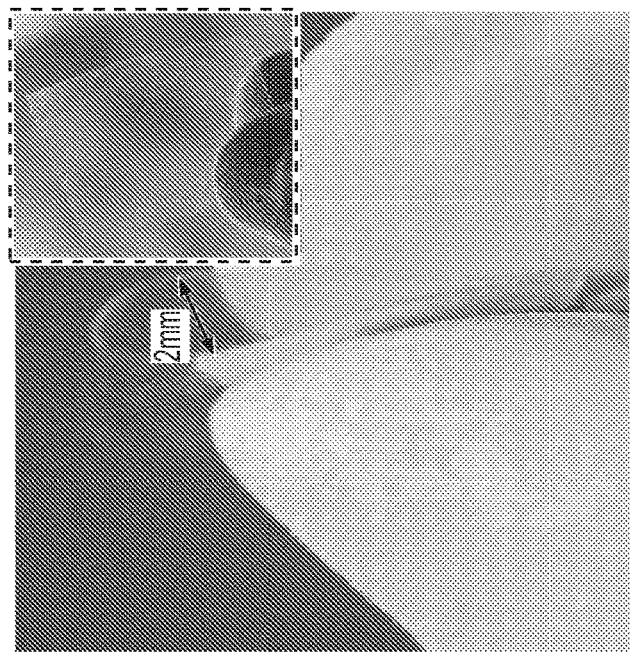

A working paper touchscreen device with a size of 2.5 by 4 inches is demonstrated, which shows excellent flexibility and high clarity (FIG. 20(c)). Detailed fabrications processes can be found in the Experiment Section. A metallic film with the thickness 8 µm was printed at the edges of the defined area of graphene electrodes by screen-printing of silver paste. A laser beam was applied to sputter the metal frame into metal lines and cut the graphene area to form patterns (FIG. 20(d), FIG. 32), where the red dotted lines guide the laser burning path. Any two adjacent burning traces define a graphene electrode, which is connected with an aforementioned metallic line patterned by a laser too. The laser is a solid state fiber laser with a wavelength of 1064 nm. We used a 2 W laser power for patterning graphene which schematically shows in FIG. 20(*e*) and 8 W for patterning silver contacts. The integrated driving circuit is bonded with metal contacts on paper at the end of the module. Clear paper shows excellent compatibility with various device fabrication processes that are optimized for plastic dry-transfer, screen printing, laser cutting, and metal contact integrations.

FIG. 20(*f*) shows our test on the linearity, an important parameter to reflect the performance of a touch screen. For a qualified touch screen, when a human's finger moves along a straight line, the device incorporated with the touch screen should respond to the exact locations where the finger passes. In the picture, the blue line drawn on paper under the touch screen was used for guiding the movement of a finger (a red arrow highlights the direction of the movement of a finger) and the image on the computer screen shows the response of the touch screen embedded in a testing module. The green dot on screen indicates the line section, where a finger has passed. The graphene-on-paper based touch screen has as excellent linearity as a high quality commercial touch product. The mechanical durability test by bending shows no degradation of graphene quality after 10,000 times, which is more durable than the ITO on plastic (FIG. 33). The as-fabricated touch screen is very flexible and its sensing performance is comparable to a regular commercial touch screen, video in Supplementary Materials FIG. 34*a-d*). The demonstrated capacitive graphene-on-paper touch-screen can be used for emerging flexible display and touch module, which is urgently demanded in custom electronics but cannot be achieved by current touch screen technology based on ITO on plastics. While clear paper-based touch-screens is as durable as its plastic counterpart, the entire device can be dissolved in water if required (video in FIG. 34*a-d*). This is extremely attractive for consumer electronics, as the large demand worldwide is posing a great environment concern.

To investigate the distribution of transmitted light in the range of 0 to 180°, an optical setup including rotating light detector was utilized to test the angular distribution of transmitted light. As shown in FIG. 21(*a*), the curve presents an expected Gaussian-like pattern, and a maximum transmitted power is displayed at the angel of 90°. Note that the incident light being perpendicular to the surface of transparent paper is defined as 90° and the scattering angle range refers to the transmitted light at angles with an intensity larger than 5% of the peak transmission intensity at 90°.

Transparent paper possessing ultra-high light scattering behavior may find its place in optoelectronics. The schematic in FIG. 21(*b*) briefly shows the light propagating path in OLED covered with a piece of transparent and hazy paper. The incident light emitted by OLED impinges on paper surface vertically and the transmitted beam is then evenly scattered by paper. This light scattering behavior of transparent paper is quite beneficial for outdoor displays, which can help on the elimination of glare effect. FIG. 21(*c*) demonstrates the glare effect of iwatch without transparent and hazy paper when it exposed to sunshine, while the iwatch with a piece of this paper exhibits excellent anti-glare effect (FIG. 21(*d*)).

In conclusion, this study provides the first demonstration that precise control of the cellulose fiber dimensions enables paper substrates with a diverse range of unique optical properties. We experimentally and computationally investigate the relation between the mesoporous structure and its optical properties, and conclude that a three-dimensional network of cellulose fibers exhibit optical properties directly related to the fiber size. A network of smaller fibers forms a near perfectly clear transparent paper with haze <1.0% while a network of larger fibers forms an entirely hazy transparent paper with haze >90%. A 2.5 by 4 inch multi-touch touch-screen was fabricated with graphene transferred on clear paper, which demonstrates excellent process compatibility of transparent paper toward device integrations. Mesoporous transparent substrates made of wood cellulose fibers will enable a new era of paper photonics, electronics, and opto-electronics that are not possible on other transparent substrates.

Materials and Methods

Fabrication of Super Clear Paper.

A TEMPO treatment applied to pretreat the bleached softwood pulp can be referred to our previous papers.(22, 23, 38) 1.0 wt % TEMPO-oxidized wood pulp was passed twice through thin z-shaped chambers with channel dimension of 200 μm in a Microfluidizer processor under a process pressure of 25,000 psi (M110 EH, Microlfuidics Inc., USA). The obtained CNF was diluted to 0.2 wt % with distilled water and kept stirring by a magnetic stirrer for 2 h to ensure the complete dispersion of CNF. Afterward, diluted CNF suspension was centrifuged at the speed of 3000 rpm/min for 20 min to remove large cellulose bundles. The supernatant was transferred into a bottle via pipette. The purified CNF suspension was poured into a non-stick container and dried in a controlled chamber.

Fabrication of Super Hazy Paper.

A regular paper with a thickness around 90 μm was fabricated by a vacuum filtration method with a well-dispersed suspension of southern yellow pine fiber. The dried sheet was immersed in BMIMC1 ionic liquid at 90° C. for 15 mins, and then transferred to a hot-press for an additional 1 h treatment. After that, the sample was immersed in methanol (Sigma-Aldrich, US) for 8 h to remove ionic liquid residue. After rinsing, the paper sheet was cold pressed and dried. The final paper have thickness ~40 μm.

Fabrication of Touch Screen Graphene-On-Clear Paper.

The fabrication process of the super clear paper/graphene touch screen is described below: 1) Graphene was grown on a Cu foil by CVD using methane as a precursor at 1030° C.; 2) For transferring graphene to super clear paper, thermal release tape was applied on the front side of graphene/Cu structure first, then oxygen plasma was used to etch the graphene at the back side of graphene/Cu structure, followed by dissolving the Cu foil in $Fe(NO_3)_3$. The thermal release tape/graphene structure was then laid on a super clear paper and heated at 100° C. to release the graphene from the thermal release tape onto the super clear paper, as illustrated in the inset image in FIGS. 6*b*. 3). the bilayer structure of graphene/clear paper was used to fabricate capacitive touch screens, where the graphene film was patterned as a group of electrodes.

Characterization.

The optical properties of the paper were measured using a UV-V is Spectrometer Lambda 35 containing an integrating sphere (PerkInElmer, USA) based on standard ASTM1003-92 "Standard Method for Haze and Luminous Transmittance of Transparent Plastic". Surface characterization was performed using a Veeco multimode scanning probe microscope (SPM) with NanoScope V controller with a model SNL-10 silicon-on-nitride tip (Veeco) using a drive frequency of ~75 kHz and a spring constant of 0.58 N/m. Prior to imaging, paper samples were mounted on magnetic sample disks using double-sided tap. Scans were collected over areas ranging from 500 $nm^2$ to 8 $μm^2$ at a scan rates of 0.46-0.92 Hz. Image data were processed by planar background subtraction using Nanoscope Analysis software, version 1.4 (Bruker). Partially dissolved paper was characterized with a Hitachi SU-70 FESEM field effect scanning electron microscopy (SEM), performed using a Jeol JXA 840A system (Jeol Instruments, Tokyo, Japan) running at 5-10 keV. The paper surface area was measured with a Micromeritics TriStar II 3020 Porosimeter Test Station. The paper pore distribution was measured with a Micromeritics TriStar II 3020 Porosimeter Test Station. The range of measurable pore sizes is between 1.7 to 120 nm. The Barrett" Joyner-Halenda (BJH) adsorption average pore algorithm is used for evaluation. The hazy paper was tested in a Skyscan 1172 μCT for morphology analysis. The sample was scanned without a filter under 40 kV at 1.0 um pixels. The 3D images were reconstructed in NRecon. Touch screen performance tested on TP Tool SIU board module operated by software FT Touch Studio.

Although a few embodiments have been shown and described, it would be appreciated by those skilled in the art that changes may be made in this embodiment without departing from the principles and spirit of the invention, the scope of which is defined in the claims and their equivalents.

What is claimed is:

1. A clear paper comprising:
    about 100% cellulose nanofibers;
    wherein the clear paper is a porous material containing mesopores in a range of 10-20 nm;
    wherein the clear paper is made of wood fibers;
    wherein the clear paper has a
    a transmittance greater than 90%; and
    an optical haze below 1%.

2. A hazy paper comprising:
    micro-sized wood fiber with an average diameter of 20-30 μm and length around 1000 μm pores with size of about 0.5 μm;
    a transmittance greater than 90%; and
    an optical haze above 90%.

3. A touch screen with a grapheme film comprising:
    a transmittance greater than 89%
    and a sheet resistance of 445 Ω/sq.

4. A method of fabricating clear paper according to claim 1 comprising:
    (a) treating bleached softwood pulp with a TEMPO-oxidized system comprising:
       (i) passing 1.0 wt % TEMPO-oxidized wood pulp through z-shaped chambers;
       (ii) diluting cellulose nanofibers to 0.2 wt % with distilled water;
       (iii) stirring cellulose nanofiber suspension with a magnetic stirrer;
       (iv) centrifuging said cellulose nanofiber suspension at a speed of 3000 rpm/min; and
       (v) drying said cellulose nanofiber suspension in a controlled chamber.

5. A method of fabricating hazy paper according to claim 2 comprising the steps of:
    immersing paper in ionic liquid 1-Butyl-3-methylimidazolium chloride;
    saturating said paper with ionic liquid; and
    washing said paper in methanol.

* * * * *